(12) United States Patent
Khvalkovskiy et al.

(10) Patent No.: US 9,105,830 B2
(45) Date of Patent: *Aug. 11, 2015

(54) METHOD AND SYSTEM FOR PROVIDING DUAL MAGNETIC TUNNELING JUNCTIONS USING SPIN-ORBIT INTERACTION-BASED SWITCHING AND MEMORIES UTILIZING THE DUAL MAGNETIC TUNNELING JUNCTIONS

(71) Applicant: Samsung Electronics Co., LTD., Gyeonggi-do (KR)

(72) Inventors: Alexey Vasilyevitch Khvalkovskiy, Milpitas, CA (US); Dmytro Apalkov, San Jose, CA (US); Mohamad Towfik Krounbi, San Jose, CA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 125 days.

This patent is subject to a terminal disclaimer.

(21) Appl. No.: 13/851,591

(22) Filed: Mar. 27, 2013

(65) Prior Publication Data

US 2014/0056061 A1 Feb. 27, 2014

Related U.S. Application Data

(63) Continuation-in-part of application No. 13/594,824, filed on Aug. 26, 2012.

(60) Provisional application No. 61/785,682, filed on Mar. 14, 2013.

(51) Int. Cl.
*G11C 11/00* (2006.01)
*H01L 43/02* (2006.01)
(Continued)

(52) U.S. Cl.
CPC .............. *H01L 43/02* (2013.01); *G11C 11/16* (2013.01); *H01F 10/3263* (2013.01);
(Continued)

(58) Field of Classification Search
USPC ......................................................... 365/158
See application file for complete search history.

(56) References Cited

U.S. PATENT DOCUMENTS 7,307,299 B2 12/2007 Koo et al.
7,430,135 B2 9/2008 Huai et al.
(Continued)

FOREIGN PATENT DOCUMENTS

JP 11144927 5/1999
JP 2009239135 10/2009
JP 2012038929 2/2012

OTHER PUBLICATIONS

AAAS, Science vol. 336, No. 6081, Liu et al., "Spin-Torque Switching with the Giant Spin Hall Effect Tantalum," pp. 555-558, May 4, 2012.

*Primary Examiner* — Hoai V Ho
*Assistant Examiner* — Pablo Huerta
(74) *Attorney, Agent, or Firm* — Convergent Law Group LLP

(57) ABSTRACT

A magnetic memory is described. The magnetic memory includes dual magnetic junctions and spin-orbit interaction (SO) active layer(s). Each dual magnetic junction includes first and second reference layers, first and second nonmagnetic spacer layers and a free layer. The free layer is magnetic and between the nonmagnetic spacer layers. The nonmagnetic spacer layers are between the corresponding reference layers and the free layer. The SO active layer(s) are adjacent to the first reference layer of each dual magnetic junction. The SO active layer(s) exert a SO torque on the first reference layer due to a current passing through the SO active layer(s) substantially perpendicular to a direction between the SO active layer(s) and the first reference layer. The first reference layer has a magnetic moment changeable by at least the SO torque. The free layer is switchable using a spin transfer write current driven through the dual magnetic junction.

30 Claims, 13 Drawing Sheets

(51) Int. Cl.
  *H01L 43/12* (2006.01)
  *G11C 11/16* (2006.01)
  *H01L 43/08* (2006.01)
  *H01F 10/32* (2006.01)
  *H01F 41/32* (2006.01)
  *H01L 27/22* (2006.01)

(52) U.S. Cl.
  CPC ............. *H01F 41/325* (2013.01); *H01L 43/08* (2013.01); *H01L 43/12* (2013.01); *H01F 10/329* (2013.01); *H01F 10/3286* (2013.01); *H01L 27/228* (2013.01)

(56) References Cited

U.S. PATENT DOCUMENTS

| | | | |
|---|---|---|---|
| 7,649,719 B2 | 1/2010 | Carey et al. | |
| 7,839,675 B2 * | 11/2010 | Koo et al. | 365/170 |
| 7,939,870 B2 | 5/2011 | Wunderlich et al. | |
| 7,994,555 B2 | 8/2011 | Koo et al. | |
| 8,125,247 B2 | 2/2012 | Koo et al. | |
| 8,264,018 B2 * | 9/2012 | Yoon et al. | 257/278 |
| 2007/0171694 A1 * | 7/2007 | Huai et al. | 365/145 |
| 2009/0161265 A1 | 6/2009 | Sugano et al. | |
| 2011/0044099 A1 * | 2/2011 | Dieny | 365/171 |
| 2011/0075476 A1 | 3/2011 | Kajiwara et al. | |
| 2011/0293967 A1 * | 12/2011 | Zhang et al. | 428/827 |
| 2012/0058575 A1 * | 3/2012 | Horng et al. | 438/3 |
| 2012/0176154 A1 * | 7/2012 | Behin-Aein et al. | 326/37 |
| 2013/0100724 A1 * | 4/2013 | Venkataraman et al. | 365/145 |
| 2013/0307097 A1 * | 11/2013 | Yi et al. | 257/421 |
| 2014/0017820 A1 * | 1/2014 | Jan et al. | 438/3 |
| 2014/0063921 A1 * | 3/2014 | Tang et al. | 365/158 |

* cited by examiner

Voltage

METHOD AND SYSTEM FOR PROVIDING DUAL MAGNETIC TUNNELING JUNCTIONS USING SPIN-ORBIT INTERACTION-BASED SWITCHING AND MEMORIES UTILIZING THE DUAL MAGNETIC TUNNELING JUNCTIONS

CROSS-REFERENCE TO RELATED APPLICATIONS

This application claims the benefit of provisional Patent Application Ser. No. 61/785,682, filed Mar. 14, 2013, entitled METHOD AND SYSTEM FOR PROVIDING INVERTED DUAL MAGNETIC TUNNELING JUNCTIONS USING SPIN-ORBIT INTERACTION-BASED SWITCHING AND MEMORIES UTILIZING THE DUAL MAGNETIC TUNNELING JUNCTIONS, assigned to the assignee of the present application, and incorporated herein by reference. This application is a continuation in-part of U.S. patent application Ser. No. 13/594,824, field Aug. 26, 2012, entitled METHOD AND SYSTEM FOR PROVIDING A MAGNETIC TUNNELING JUNCTION USING SPIN-ORBIT INTERACTION BASED SWITCHING AND MEMORIES UTILIZING THE MAGNETIC TUNNELING JUNCTION, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-RAM). STT-RAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional dual magnetic tunneling junction (MTJ) 10 as it may be used in a conventional STT-RAM. The conventional dual MTJ 10 typically resides on a bottom contact 11, uses conventional seed layer(s) 12 and includes a conventional antiferromagnetic (AFM) layer 14, a conventional first pinned, or reference layer 16, a conventional first tunneling barrier layer 18, a conventional free layer 20, a conventional second tunneling barrier layer 22, a conventional second pinned layer 24, a conventional second AFM layer 26 and a conventional capping layer 28. Also shown is top contact 30.

Conventional contacts 11 and 30 are used in driving the current in a current-perpendicular-to-plane (CPP) direction, or along the z-axis as shown in FIG. 1. The conventional seed layer(s) 12 are typically utilized to aid in the growth of subsequent layers, such as the AFM layer 14, having a desired crystal structure. The conventional tunneling barrier layers 18 and 22 are each nonmagnetic and are, for example, a thin insulator such as MgO.

The conventional pinned layers 16/24 and the conventional free layer 20 are magnetic. The magnetizations 17 and 25 of the conventional reference layers 16 and 24 fixed, or pinned, in a particular direction, typically by an exchange-bias interaction with the AFM layers 14 and 26. Although depicted as a simple (single) layer, the conventional reference layers 16 and 24 may include multiple layers. For example, the conventional reference layers 16 and/or 24 may be a synthetic antiferromagnetic (SAF) layer including magnetic layers antiferromagnetically coupled through thin conductive layers, such as Ru. In such a SAF, multiple magnetic layers interleaved with a thin layer of Ru may be used. In another embodiment, the coupling across the Ru layers can be ferromagnetic. Although a single reference layer 16 or 26 and single tunneling barrier 18 or 24 might be used, the dual MTJ 10 may have the benefits of enhance spin torque if the reference layer 16 and 26 are fixed in in the dual state (magnetic moments 17 and 25 of reference layers 16 and 26 antiparallel). However, a dual MTJ 10 in the dual state may have reduced magnetoresistance. In contrast, if the reference layers 16 and 26 are fixed in the antidual state (magnetic moments 17 and 25 of reference layers 16 and 26 parallel) the dual MTJ 10 may have enhanced magnetoresistance. Moreover, in the antidual configuration, the spin-transfer torque contributions from two reference layers 16 and 26 counteract each other. As a result, in the antidual state, the amplitude of the spin-transfer torque on the free layer may be substantially reduced comparatively to that for a dual state or even that for a similar cell with a single barrier. Therefore, the read error rate, which is a probability of an unintentionally switching the free layer during the read operation, may be significantly reduced. This may allow significantly increasing the sensing margin (which is the difference between the minimum read current acceptable by the sense amplifier and the current resulting in intolerable read errors), enabling read currents to be close to the write currents in the dual configuration. This may also allow relax the requirements on the MTJ cell parameters, particularly on the thermal stability of the MTJ cell, since the read error rates depend on the cell thermal stability. However, this also means that spin transfer based switching may require a larger write current.

The conventional free layer 20 has a changeable magnetization 21. Although depicted as a simple layer, the conventional free layer 20 may also include multiple layers. For example, the conventional free layer 20 may be a synthetic layer including magnetic layers antiferromagnetically or ferromagnetically coupled through thin conductive layers, such as Ru. Although shown as in-plane, the magnetization 21 of the conventional free layer 20 may have a perpendicular anisotropy. Similarly, the magnetization 17 of the conventional pinned layer 16 may also be perpendicular to the plane.

To switch the magnetization 21 of the conventional free layer 20, a current is driven perpendicular to plane (in the z-direction). The current carriers are spin polarized and exert a torque on the magnetization 21 of the conventional free layer. In the conventional dual MTJ 10, the spin torque from the reference layers 16 and 24 would be additive as these layers are in the anti-dual state (magnetic moments 17 and 25 antiparallel). The spin transfer torque on the magnetic moment 21 of the conventional free layer 20 is initially small when the magnetic moment 21 is parallel to the easy axis (the stable state). As such, the stable state of the magnetic moment 21 also corresponds to a stagnation point in switching. Due to thermal fluctuations, the magnetic moment 21 may rotate from alignment with the easy axis of the conventional free layer 20. The spin transfer torque may then act to increasing effect, and the magnetic moment of the free layer 20 switched. When a sufficient current is driven from the top contact 30 to the bottom contact 11, the magnetization 21 of the conventional free layer 20 may switch to be parallel to the magnetization 17 of the conventional reference layer 16. When a sufficient current is driven from the bottom contact 11 to the top contact 30, the magnetization 21 of the free layer may switch to be antiparallel to that of the reference layer 16. The differences in magnetic configurations correspond to different magnetoresistances and thus different logical states (e.g. a logical "0" and a logical "1") of the conventional MTJ 10.

When used in STT-RAM applications, the free layer 20 of the conventional MTJ 10 is desired to be switched at a relatively low current in order to prevent damage to the conventional magnetic junction 10, reduce the size of the transistor which supplies this current (not shown) and reduce energy consumption for the memory operation. In addition, a short current pulse is desired to be used in programming the conventional magnetic element 10 at higher data rates. For example, current pulses on the order of 5-30 ns or less are desired to allow the magnetization of the conventional free layer 20 to switch faster.

Although the conventional dual MTJ 10 may be written using spin transfer and used in an STT-RAM, there are drawbacks. For example, the write error rates may be higher than desired for memories having an acceptable pulse width. The write error rate (WER) is the probability that a cell (i.e. the magnetization 21 of free layer 20 of the conventional magnetic junction) is not switched when subjected to a current that is at least equal to the typical switching current. The WER is desired to be $10^{-9}$ or less. However, very high currents can be required to achieve switching of the conventional free layer 20 at this WER value. In addition, it has been determined that the WER may be challenging to improve for shorter write current pulses. For example, FIG. 2 is a graph 50 depicts trends in WERs for pulses of different widths. Note that actual data are not plotted in the graph 50. Instead, the graph 50 is meant to indicate trends. The pulse width, from longest to shortest, is for curves 52, 54, 56, and 58. As can be seen in the graph 50, for higher pulse widths, the WER versus voltage applied to the junction 10 has a higher slope. Thus, application of a higher voltage for the same pulse width may bring about a significant reduction in the WER. However, as the pulse widths shorten in curves 54, 56, and 58, the slope of the curves 54, 56, and 58 decreases. For a decreasing pulse width, an increase in voltage and/or current is less likely to bring about a reduction in the WER. At sufficiently short pulses, even high voltages/currents do not result in a lower error rate. Consequently, memories employing the conventional MTJ 10 may have unacceptably high WER that may not be cured by an increase in voltage. Further, to obtain such a high spin transfer torque the reference layers 16 and 26 have their magnetic moments 17 and 25 in the antidual state (fixed in opposite directions). When in this state, there is a cancellation of magnetoresistance during a read operation, which lowers the read signal. Such a reduction in signal is undesirable.

Accordingly, what is needed is a method and system that may improve the performance of the spin transfer torque based memories. The method and system described herein address such a need.

BRIEF SUMMARY OF THE INVENTION

A magnetic memory is described. The magnetic memory includes dual magnetic junctions and at least one spin-orbit interaction (SO) active layer. Each of the dual magnetic junctions includes a first reference layer, a first nonmagnetic spacer layer, a free layer, a second nonmagnetic spacer layer and a second reference layer. The free layer is magnetic and resides between the first nonmagnetic spacer layer and the second nonmagnetic spacer layer. The first nonmagnetic spacer layer is between the first reference layer and the free layer. The second nonmagnetic spacer layer is between the second reference layer and the free layer. The SO active layer(s) are adjacent to the first reference layer of each of the dual magnetic junctions. The SO active layer(s) are configured to exert a SO torque on the first reference layer due to a current passing through the at least one SO active layer substantially perpendicular to a direction between the at least one SO active layer and the first reference layer. The first reference layer has a magnetic moment configured to be changeable by at least the SO torque. The free layer is configured to be switchable using a spin transfer write current driven through the dual magnetic junction.

DETAILED DESCRIPTION OF THE INVENTION

Figure 1:
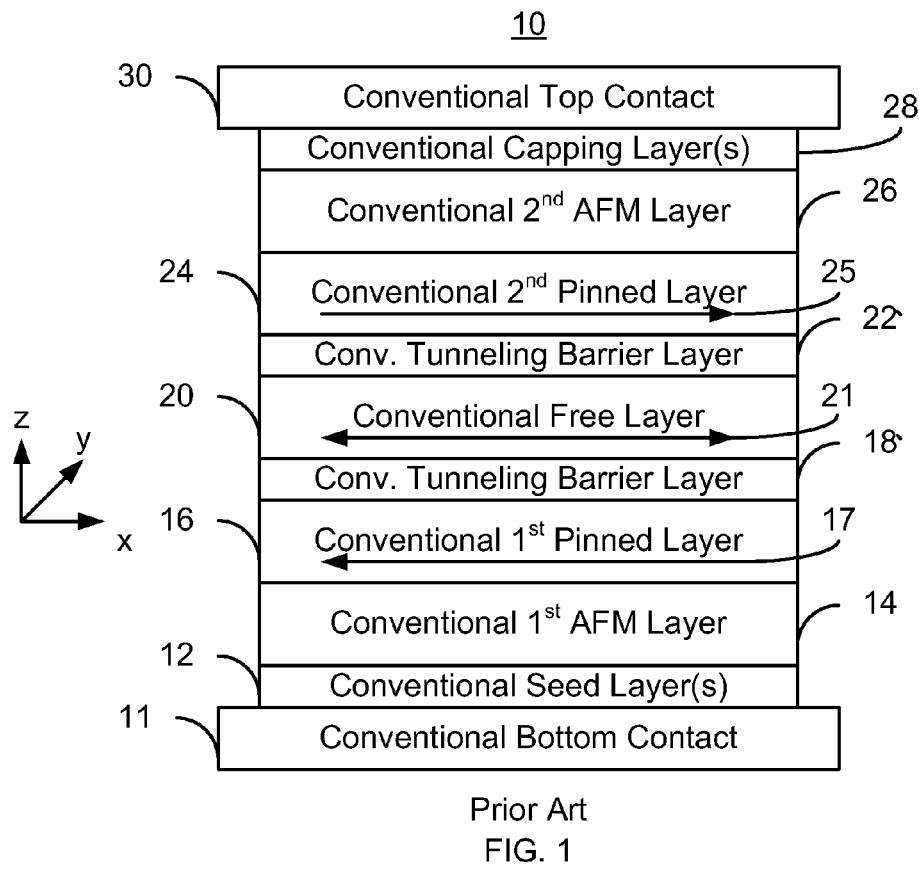
FIG. 1 depicts a conventional magnetic junction.
Figure 2:
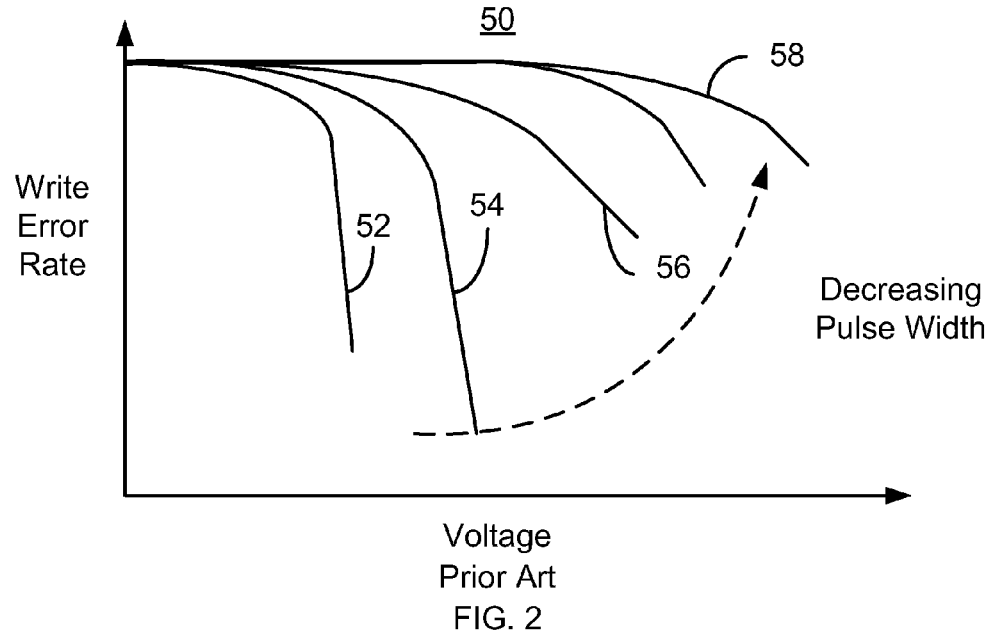
FIG. 2 depicts write error rate versus voltage for a conventional spin transfer torque RAM.

The exemplary embodiments relate to magnetic junctions usable in magnetic devices, such as magnetic memories, and the devices using such magnetic junctions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The exemplary embodiments describe methods and systems for providing a magnetic memory. The magnetic memory includes dual magnetic junctions and at least one spin-orbit interaction (SO) active layer. Each of the dual magnetic junctions includes a first reference layer, a first nonmagnetic spacer layer, a free layer, a second nonmagnetic spacer layer and a second reference layer. The free layer is magnetic and resides between the first nonmagnetic spacer layer and the second nonmagnetic spacer layer. The first nonmagnetic spacer layer is between the first reference layer and the free layer. The second nonmagnetic spacer layer is between the second reference layer and the free layer. The SO active layer(s) are adjacent to the first reference layer of each of the dual magnetic junctions. The SO active layer(s) are configured to exert a SO torque on the first reference layer due to a current passing through the at least one SO active layer substantially perpendicular to a direction between the at least one SO active layer and the first reference layer. The first reference layer has a magnetic moment configured to be changeable by at least the SO torque. The free layer is configured to be switchable using a spin transfer write current driven through the dual magnetic junction.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of spin-orbit interaction, the spin transfer phenomenon, of magnetic anisotropy, and other physical phenomenon. Consequently, one of ordinary skill in the art will readily recognize that theoretical explanations of the behavior of the method and system are made based upon this current understanding of spin-orbit interaction, spin transfer, magnetic anisotropy and other physical phenomenon. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions, spin-orbit active layers, and/or other structures having particular layers. However, one of ordinary skill in the art will readily recognize that magnetic junctions, spin-orbit active layers, and/or other structures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions. However, one of ordinary skill in the art will readily recognize that the method and system are consistent with the use of magnetic memories having multiple magnetic junctions. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 3:
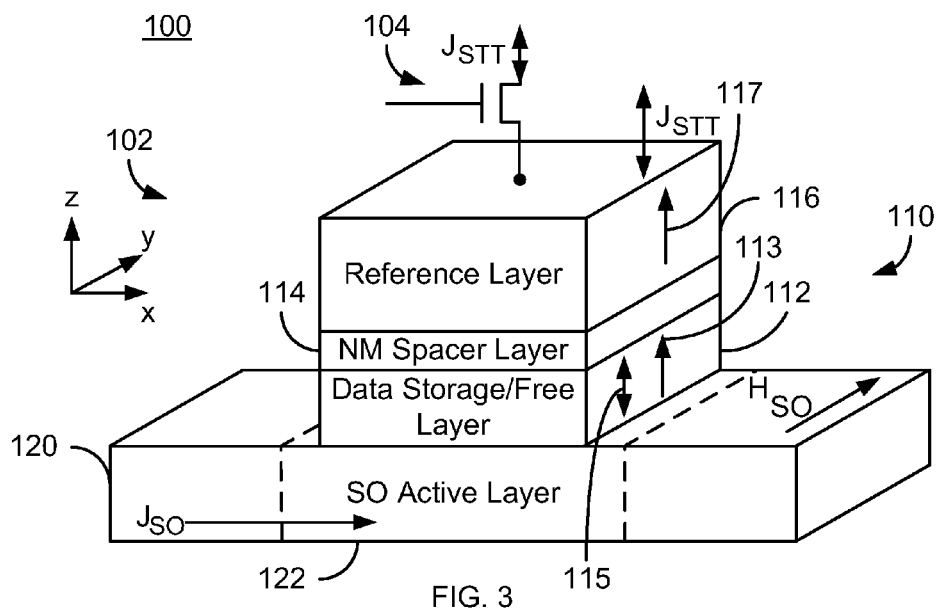
FIG. 3 depicts an exemplary embodiment of a magnetic junction switched using spin-orbit interaction.

FIG. 3 depicts an exemplary embodiment of a portion of a previously developed magnetic memory 100 that utilizes spin-orbit interaction in switching. For clarity, FIG. 3 is not to scale. In addition, portions of the magnetic memory 100 such as bit lines, word lines, row selectors and column selectors are not shown or not labeled as such. The magnetic memory 100 includes a magnetic storage cell 102. The magnetic storage cell 102 may be one of a number of magnetic storage cells ordered in an array. Each of the magnetic storage cells includes a selection device 104 and a magnetic junction 110. In some embodiments, multiple magnetic junctions 110 and/or multiple selection devices 104 may be used in a single cell. Also shown is bus 120 including a spin-orbit interaction (SO) active layer 122. The common bus 120 stretches across multiple storage cells, of which only one is shown in FIG. 3. In the embodiment shown, the material(s) forming the SO active layer 122 are only in the vicinity of the storage cell 102. Thus, other materials, including but not limited to higher conductivity and/or nonmagnetic materials, may be used between the cells 102. However, in other embodiments, the common bus 120 may consist of the SO active layer 122. In still other embodiments, the SO active layer 122 may be separate from the common bus 120. For example, the SO active layer 122 may reside between the magnetic junction 110 and the common bus 120. In other embodiments, the SO active layer 122 may be included as part of the storage cell 102 and the common bus 120 might be omitted.

In the embodiment shown, the magnetic junction 110 includes a data storage, or free layer 112, a nonmagnetic spacer layer 114, and a reference layer 116. The spacer layer 114 is nonmagnetic. In some embodiments, the spacer layer 114 is an insulator, for example a tunneling barrier. In such embodiments, each spacer layer 114 may include crystalline MgO, which may enhance the TMR and spin transfer efficiency of and/or the spin-orbit interaction for the magnetic junction 110. In other embodiments, the spacer layer 114 may be a conductor, such as Cu. In alternate embodiments, the spacer layer 114 might have another structure, for example a granular layer including conductive channels in an insulating matrix.

The free layer 112 is a free layer 112 having a magnetic moment (not shown) that is switchable. When the magnetic junction 110 is quiescent (not being switched), the magnetic moment of the free layer 112 lies along the easy axis of the free layer 112. The magnetic moment of the reference layer 112 is desired to be substantially fixed in place during operation of the magnetic memory 100. The reference layer 116 is depicted as a single layer. However, in other embodiments, the reference layer 116 may be a multilayer including, but not limited to a synthetic antiferromagnet having ferromagnetic layers separated by nonmagnetic layer(s) that may be Ru. In some embodiments, the magnetic junction 110 also includes a pinning layer, such as an antiferromagnetic layer (not shown) that fixes the magnetic moment of the reference layer 116 in place. In other embodiments, the magnetic moment of the reference layer 116 is fixed in another manner. The free and reference layers 112 and 116 are ferromagnetic and thus may include one or more of Fe, Ni, and Co. Although magnetic moments are not shown, the magnetic moments of the layers 112 and 116 may be perpendicular to plane in some embodiments. Thus, each of the layers 112 and/or 116 may have a perpendicular anisotropy field that exceeds its out-of-plane demagnetization field (typically a significant fraction of $4\pi M_s$). In other embodiments, the magnetic moments are in plane.

The magnetic moment of the free layer 112 is switched using the spin-orbit interaction effect, described below. In some embodiments, the free layer 112 may be switched using a combination of effects. For example, the magnetic moment of the free layer 112 may be switched using spin transfer torque as a primary effect that may be assisted by torque induced by the spin-orbit interaction. However, in other embodiments, the primary switching mechanism is torque induced by the spin-orbit interaction. In such embodiments, another effect including but not limited to spin transfer torque, may assist in switching and/or selecting the magnetic junction 110. In still other embodiments, the free layer 112 magnetic moment is switched using only the spin-orbit interaction effect.

The SO active layer 122 is a layer that has a strong spin-orbit interaction and that can be used in switching the magnetic moment of the free layer 112. The SO active layer 122 may be used in generating a spin-orbit field $H_{SO}$. More specifically, a current is driven in plane through the SO active layer 122. This may be achieved by driving a current (e.g. with a current density $J_{SO}$) through the common bus 120. Due to the spin-orbit interaction in the SO active layer 122, the current flowing through this layer may result in the spin-orbit field $H_{SO}$ proportional to the current density $J_{SO}$. For some embodiments, the spin-orbit field $H_{SO}$ is parallel to a vector $p_{SO}$, which is determined by the material parameters and geometry of the SO active layer 122 and by the direction of the current $J_{SO}$. For some other embodiments $H_{SO}$ is parallel to a vector $[M \times p_{SO}]$, where M is vector of the magnetic moment 115. For some other embodiments it is proportional to a linear combination of the vectors $[M \times p_{SO}]$ and $p_{SO}$. This spin-orbit field $H_{SO}$ is equivalent to the spin-orbit torque, $T_{SO}$, on the magnetic moment 115. The spin-orbit torque on the free layer 112 is given by $T_{SO} = -\gamma[M \times H_{SO}]$, where M is the vector of the magnetic moment 115. This mutually correlated torque and field are thus interchangeably referred to herein as spin-orbit field and spin-orbit torque. This reflects the fact that the spin-orbit interaction is the origin of the spin-orbit torque and spin-orbit field. This terminology also differentiates this spin-orbit (SO) torque from the more conventional spin-transfer torque (STT). Spin-orbit torque occurs for a current driven in plane in the SO active layer 122 and a spin-orbit interaction. For example, in the embodiment shown, the spin-orbit torque occurs for the current density $J_{SO}$. In contrast, spin transfer torque is due to a perpendicular-to-plane current flowing through the free layer 112, spacer layer 114 and reference layer 116, that injects spin polarized charge carriers into the free layer 112. In the embodiment shown, the spin transfer torque is due to the current density $J_{STT}$. The spin-orbit torque $T_{SO}$ may rapidly deflect the magnetic moment of the free layer 112 from its equilibrium state parallel to the easy axis.

The current flowing through the SO active layer 122 may have very large current density (up to, or on the order of $10^8$ A/cm$^2$) because the current is in plane. This current density for the SO active layer 122 is much larger than the current density which flows through the barrier of the MTJ cell as the latter is limited by the size of the cell transistor and MTJ breakdown voltage. Thus, the perpendicular-to-plane current through the magnetic junction 110 typically does not exceed few MA/cm$^2$. Therefore, the spin-orbit torque $T_{SO}$ generated by $J_{SO}$ can be significantly larger than the maximum STT torque generated by the current flowing through the MTJ cell. As a result, the spin-orbit torque $T_{SO}$ may tilt the magnetization of the free layer considerably faster than conventional STT torque. In some embodiments, another mechanism such as spin transfer may be used to complete switching. In other embodiments, switching can be completed using spin-orbit torque. The spin-orbit field/spin-orbit torque generated may thus be used in switching the magnetic moment of the free layer 112.

In some embodiments, the SO interaction may include some combination of two effects: the spin Hall effect and the Rashba effect. In many SO active layers, the spin-orbit interaction includes both the spin Hall effect and the Rashba effect, but one of the two dominates. Other spin-orbit effects may also be employed. The spin Hall effect is generally considered to be a bulk effect. Typically for the spin Hall effect the vector $p_{SO}$ at a given surface of the spin-orbit active line 122 is directed perpendicular to the direction of the current and to the normal vector to that surface. Materials that exhibit the spin Hall effect often include heavy metals or materials doped by heavy metals. For example, such materials can be selected from at least one of A and M doped by B. A includes Y, Zr, Nb, Mo, Tc, Ru, Rh, Pd, Cd, In, Sb, Te, Hf, Ta (including high-resistive amorphous β-Ta), W, Re, Os, Ir, Pt, Au, Hg, Tl, Pb, Bi, Po, At, and/or their combinations; M includes at least one of Al, Ti, V, Cr, Mn, Cu, Zn, Ag, Hf, Ta, W, Re, Pt, Au, Hg, Pb, Si, Ga, GaMn or GaAs, and B includes at least one of V, Cr, Mn, Fe, Co, Ni, P, S, Zn, Ga, Ge, As, Se, Y, Zr, Nb, Mo, Tc, Ru, Rh, Pd, Ag, Cd, In Sb, Te, I, Lu, Hf, Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, Yb. In some embodiments, the SO active layer 122 may include or consist of Ir doped Cu and/or Bi doped Cu. The doping is generally in the range of 0.1 through 10 atomic percent. In other embodiments, other materials may be used.

Another source of the spin-orbit field $H_{SO}$ in the SO active layer 122 can be related to the spin-orbit interaction at the interfaces. The magnitude of the spin-orbit field in this case is often related to the magnitude of the crystal field, which is often high at the interface. Due to the mismatch of the lattice parameters of the adjacent layers, the presence of heavy metals at the interface, and other effects, the spin-orbit interaction can be considerably large at some interfaces. A strong spin-orbit effect at the interface associated with the gradient of the crystal field in the perpendicular to the interface plane direction is often referred to as the Rashba effect. As used herein, however, the Rashba effect refers to a spin-orbit interaction at the interface regardless of its origin and direction. Note that in at least some embodiments, the interfaces for the SO active layer 122 should differ to get a sizable Rashba affect. For example, the Rashba effect may occur for the SO active layer 122 being/having a Pt layer adjoining the magnetic junction 110, a Co layer for the free layer 112, and an aluminum oxide or MgO nonmagnetic layer 114. In some embodiments, other materials may be used.

The unit vector of spin-polarization $p_{SO}$ for the Rashba effect is typically perpendicular to the crystal field and the current direction. Many SO active layers 122 have a crystal field perpendicular to the plane of the layer 120. As such, the spin-orbit polarization would be in plane, for example in the direction of $H_{SO}$ in FIG. 3. Alternatively, the SO active layer 122 may have a crystalline field in plane or tilted to the plane. As such, the SO active layer 122 has a spin-orbit polarization perpendicular to plane (not shown in FIG. 3) or correspondingly tilted to the plane (not shown in FIG. 3). In such embodiments, the SO active layer 122 may be a surface alloy. For example the SO active layer 122 may include at least one of Cu, Zn, Ga, Ge, As, Se, Y, Zr, Nb, Mo, Tc, Ru, Rh, Pd, Ag, Cd, In, Sn, Sb, Te, I, Lu, Hf, Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, Yb, and/or their combinations. In other embodiments, the SO active layer 122 may include surface alloys of A/B, e.g. atoms of A residing on a (111) surface of a host material B such that on the top atomic layers are a mixture of A and B. A includes at least one of Cu, Zn, Ga, Ge, As, Se, Y, Zr, Nb, Mo, Tc, Ru, Rh, Pd, Ag, Cd, In, Sn, Sb, Te, I, Lu, Hf, Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, Yb, and B includes at least one of Si, Zn, Cu, Ag, Au, W, Zn, Cr, Pt, Pd. In many embodiments, A includes two or three different materials. In some embodiments, at least 0.1 to not more than three monolayers of A are deposited. In some such embodiments approximately ⅓ of a monolayer of A is deposited. In some embodiments, this can be one or more of substitutional Bi/Ag, substitutional Pb/Ag, substitutional Sb/Ag, substitutional Bi/Si, substitutional Ag/Pt, substitutional Pb/Ge, substitutional Bi/Cu, and a bilayer including a layer residing on a (111) surface of Au, Ag, Cu or Si. In other embodiments, the SO active layer 122 may include compounds like InGaAs, HgCdTe or bilayers $LaAlO_3/SrTiO_3$, $LaTiO_3/SrTiO_3$. In other embodiments, other materials may be used. For some embodiments, Rashba effect would result in the spin-orbit torque $T_{SO}$ and corresponding spin-orbit field $H_{SO}$ on the free layer 112.

Thus, the magnetic memory 100 may use spin-orbit interaction and the spin-orbit field generated by the SO layer 120 in switching of the magnetic moment of the free layer 112. In some embodiments, the SO active layer 122 may rely one or both of the spin-Hall effect and the Rashba effect to generate the spin-orbit field $H_{SO}$. Consequently, as used herein, terms such as the "spin-orbit effect", "spin-orbit field" and/or "spin-orbit interactions" may include spin-orbit coupling via the Rashba effect, the spin Hall effect, some combination of the two effects, and/or some other spin-orbit interaction or spin-orbit interaction-like effect. The spin-orbit fields can exert a torque on the magnetic moment of the data storage/free layer 112. This spin-orbit torque can be used in switching the magnetic moment of the free layer 112. In some embodiments, the spin-orbit field assists in switching the magnetic moment of the free layer 112. Another mechanism, such as spin transfer torque, is the primary switching mechanism. In other embodiments, the spin-orbit torque is the primary switching mechanism for the magnetic moment of the free layer 112. However, in some such embodiments, the spin-orbit torque may be assisted by another mechanism such as spin transfer torque. The assistance may be in switching the magnetic moment of the free layer 112 and/or in selecting the magnetic junction to be switched.

Because the spin-orbit torque may be used in switching the magnetic moment of the free layer 112, performance of the memory 100 may be improved. As discussed above, the spin-orbit torque generated by the SO active layer 122 may reduce the switching time of the magnetic junction 110. The spin-orbit torque typically has a high efficiency $P_{SO}$ and is proportional to the current $J_{SO}$. Because this current density is in plane and does not flow through the spacer layer 114, this spin-orbit current may be increased without damage to the magnetic junction 110. As a result, the spin-orbit field and spin-orbit torque may be increased. Thus, the write time may be reduced and the write error rate improved. Thus performance of the memory 100 may be improved.

Although the previously developed memory 100 functions, one of ordinary skill in the art will recognize that further improvements are desired. For example, in the previously developed memory the SO active layer 122 applies the SO torque to the free layer 112 in order to aid in switching. To do so, the SO active layer 122 is close to the free layer 112. For example, the SO active layer 122 adjoins the free layer 112 or is separated from the free layer 112 by only an optional spacer layer. In either case, the SO torque acts on the free layer 112. Thus, the magnetic junction 110 is a single magnetic junction having one free layer 112 and one reference layer 116. Benefits of other configurations, such as a dual magnetic junction having two reference layers and two nonmagnetic spacer layers, may not be attained.

Figure 4:
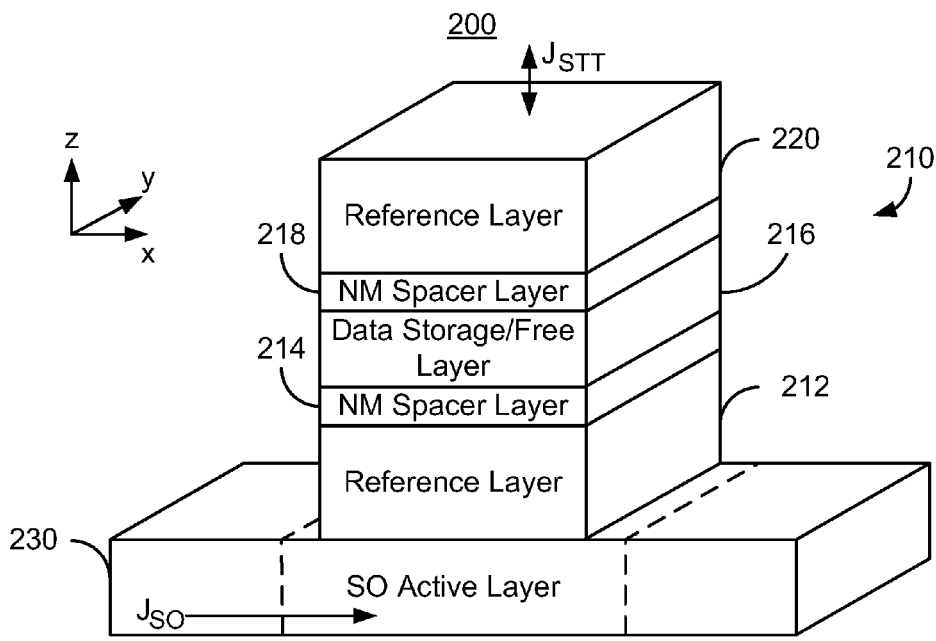
FIG. 4 depicts an exemplary embodiment of a portion of a magnetic memory that includes a dual magnetic junction switched using spin-orbit interaction.

FIG. 4 depicts an exemplary embodiment of a portion of a magnetic memory 200 that includes dual magnetic junction 210 switched using spin-orbit interaction. For clarity, FIG. 4 is not to scale. In addition, portions of the magnetic memory 200 such as bit lines, word lines, row selectors and column selectors are not shown or not labeled as such. The magnetic memory 200 includes a magnetic storage cell that has at least one magnetic junction 210 therein. In some embodiments, the magnetic storage cell may have additional components including but not limited to another magnetic junction and one or more selection devices. Such a selection device may be transistor. The magnetic storage cell may be one of a number of magnetic storage cells ordered in an array.

In the embodiment shown, the magnetic junction 210 includes a first reference layer 212, a first nonmagnetic spacer layer 214, the data storage/free layer 216, a second nonmagnetic spacer layer 218 and a second reference layer 220. The spacer layers 214 and 218 are each nonmagnetic. In some embodiments, one or both of the spacer layers 214 and 218 is an insulator, for example a tunneling barrier. In such embodiments, each spacer layer 214 and 218 may include crystalline MgO, which may enhance the TMR and spin transfer efficiency of and/or the spin-orbit interaction for the magnetic junction 210. In other embodiments, the spacer layer 214 and/or 218 may be a conductor, such as Cu. In alternate embodiments, the spacer layer 214 and/or 218 might have another structure, for example a granular layer including conductive channels in an insulating matrix.

The free layer 216 is a free layer 216 having a magnetic moment (not shown) that is switchable. When the magnetic junction 110 is quiescent (not being switched), the magnetic moment of the free layer 216 lies along the easy axis of the free layer 216. In some embodiments, the free layer 216 is a single layer including a ferromagnetic material and/or alloy. In other embodiments, the free layer 216 may be a multilayer. The multilayer may be formed of ferromagnetic layers or a mixture of ferromagnetic and nonferromagnetic layer(s). For example, the free layer 216 may be a synthetic antiferromagnet (SAF) including magnetic layers interleaved with nonmagnetic layer(s) such as Ru. The free layer 216 may also be a ferromagnetic multilayer.

The magnetic junction 210 also includes reference layers 212 and 220. The reference layer(s) 212 and/or 220 may be a simple layer composed of a ferromagnetic material or may be a multilayer. In some embodiments, the reference layers 212 and/or 220 may include ferromagnetic layers and nonmagnetic layers. In some such embodiments, the reference layer(s) 212 and/or 220 may be a SAF.

The magnetic moment (not shown) of the reference layer 220 is desired to be fixed. In some embodiments, therefore, the dual magnetic junction 210 may include a pinning layer that pins the magnetic moment of the reference layer in place. For example, such a pinning layer may be an antiferromagnetic (AFM) layer that adjoins the reference layer 220. In other embodiments, the magnetic moment of the reference layer 220 is fixed in another manner. The free and reference layers 212, 216 and 220 are ferromagnetic and thus may include one or more of Fe, Ni, and Co. Although magnetic moments are not shown, the magnetic moments of the layers 212, 216 and 220 may be perpendicular to plane in some embodiments. Thus, each of the layers 212, 216 and/or 220 may have a perpendicular anisotropy field that exceeds its out-of-plane demagnetization field (typically a significant fraction of $4\pi M_s$). In other embodiments, the magnetic moments are in plane.

The SO active layer 230 has a strong spin-orbit interaction that may be used in generating a SO field $H_{SO}$. The SO active layer 230 is thus analogous to the SO active layer 122. The SO interaction may be from the spin Hall effect, the Rashba effect, another effect or some combination thereof. In the embodiment shown, the SO active layer 230 may be the entire line. Thus, the SO active layer 230 may extend over multiple magnetic junctions 210. In other embodiments, the SO active layer 230 may simply be in the region of the magnetic junction 210. This is indicated by dashed lines in the layer 230. In still other embodiments, the SO active layer may reside between the magnetic junction 210 (and thus the reference layer 212) and the word line that carries the in-plane current $J_{SO}$. For simplicity, the reference numeral 230 will be used both for the line and the portions of the line forming the SO active layer.

In operation, a current, $J_{SO}$, is driven in plane through the SO active layer 230. The current through the SO active layer 230 has an associated spin-orbit interaction that may result in the SO field $H_{SO}$. This spin-orbit field $H_{SO}$ is analogous to the spin-orbit torque, $T_{SO}$, as described above. The SO active layer 230 may thus include materials selected from A and M doped by B. A includes Y, Zr, Nb, Mo, Tc, Ru, Rh, Pd, Cd, In, Sb, Te, Hf, Ta (including high-resistive amorphous β-Ta), W, Re, Os, Ir, Pt, Au, Hg, Tl, Pb, Bi, Po, At, and/or their combinations; M includes at least one of Al, Ti, V, Cr, Mn, Cu, Zn, Ag, Hf, Ta, W, Re, Pt, Au, Hg, Pb, Si, Ga, GaMn or GaAs, and B includes at least one of V, Cr, Mn, Fe, Co, Ni, P, S, Zn, Ga, Ge, As, Se, Y, Zr, Nb, Mo, Tc, Ru, Rh, Pd, Ag, Cd, In Sb, Te, I, Lu, Hf, Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, Yb. In some embodiments, the SO active layer 230 may include or consist of Ir doped Cu and/or Bi doped Cu. The doping is generally in the range of 0.1 through 10 atomic percent. In other embodiments, other materials may be used. In other embodiments, The SO active layer 230 may also have an SO interaction related to the spin-orbit interaction at the interfaces. The magnitude of the spin-orbit field in this case is often related to the magnitude of the crystal field, which is often high at the interface. Due to the mismatch of the lattice parameters of the adjacent layers, the presence of heavy metals at the interface, and other effects, the spin-orbit interaction can be considerably large at some interfaces. For example, the SO active layer 230 may be/have a Pt layer adjoining the magnetic junction 210, a Co layer for the reference layer 212, and an aluminum oxide or MgO nonmagnetic layer. In some embodiments, other materials may be used.

In some embodiments, the SO active layer 230 may be a surface alloy. For example the SO active layer 230 may include at least one of Cu, Zn, Ga, Ge, As, Se, Y, Zr, Nb, Mo, Tc, Ru, Rh, Pd, Ag, Cd, In, Sn, Sb, Te, I, Lu, Hf, Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, Yb, and/or their combinations. In other embodiments, the SO active layer 230 may include surface alloys of A/B, e.g. atoms of A residing on a (111) surface of a host material B such that on the top atomic layers are a mixture of A and B. A includes at least one of Cu, Zn, Ga, Ge, As, Se, Y, Zr, Nb, Mo, Tc, Ru, Rh, Pd, Ag, Cd, In, Sn, Sb, Te, I, Lu, Hf, Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, Yb, and B includes at least one of Si, Zn, Cu, Ag, Au, W, Zn, Cr, Pt, Pd. In many embodiments, A includes two or three different materials. In some embodiments, at least 0.1 to not more than three monolayers of A are deposited. In some such embodiments approximately ⅓ of a monolayer of A is deposited. In some embodiments, this can be one or more of substitutional Bi/Ag, substitutional Pb/Ag, substitutional Sb/Ag, substitutional Bi/Si, substitutional Ag/Pt, substitutional Pb/Ge, substitutional Bi/Cu, and a bilayer including a layer residing on a (111) surface of Au, Ag, Cu or Si. In other embodiments, the SO active layer 230 may include compounds like InGaAs, HgCdTe or bilayers LaAlO₃/SrTiO₃, LaTiO₃/SrTiO₃. In other embodiments, other materials may be used. For some embodiments, Rashba effect would result in the spin-orbit torque $T_{SO}$ and corresponding spin-orbit field $H_{SO}$ on the reference layer 212.

In some embodiments, a spin diffusion layer (not shown in FIG. 4) may reside between the reference layer 212 and the SO active layer 230. The optional spin diffusion layer 230 for some embodiments is a metal. In other embodiments, however, this layer can be a thin insulating material, e.g. crystalline MgO or other oxide or other insulating layer. The resistance-area (RA) of such layer should be small, e.g. smaller than 2 Ohm-μm². In other embodiments, the optional spin-diffusion layer can be a multilayer including of two or more layers of different materials. The optional spin diffusion insertion layer may be used to diminish the contribution to the spin-orbit field or/and to enhance the contribution to the spin-orbit field if this is desired to be the primary contribution used in switching the magnetic junction 210. The optional spin diffusion insertion layer may also be used to provide an improved seed layer for the reference layer 212 and/or to reduce damping of the reference layer, which can be associated with a proximity to the SO active layer 230. However, in other embodiments, as shown in FIG. 4, the spin diffusion layer may be omitted.

The magnetic moment of the reference layer 212 is configured to be changed using the spin orbit interaction from the SO active layer 230. However, the magnetic moment of the reference layer 212 is fixed for read current and any spin transfer current driven through the magnetic junction 210. In some embodiments, the magnetic moment of the reference layer 212 may be perturbed from its equilibrium position by the SO torque from the SO active layer 230. In other embodiments, the magnetic moment of the reference layer 212 is switched between equilibrium positions using the SO torque from the SO active layer 230. For example, the magnetic moment of the reference layer 212 may be switched between states so that the magnetic moments of the layers 212 and 220 are in the dual and antidual states for writing and reading, respectively. In such embodiments, the magnetic moment of the reference layer 212 may be stable in the dual and antidual states or may require the SO torque for stability. In still other embodiments, some combination of the effects may be used. For example, the reference layer magnetic moment may be switched to the dual state and perturbed from being parallel/antiparallel from the free layer magnetic moment for writing. For reading, the magnetic moment of the reference layer 212 may be switched to the antidual state.

The free layer 216 may be written using a combination of SO torque and spin transfer torque. More specifically, the current $J_{SO}$ is driven in plane through the SO active layer 230. The current through the SO active layer 230 has an associated spin-orbit interaction that may result in the spin-orbit field $H_{SO}$. This spin-orbit field $H_{SO}$ is equivalent to the spin-orbit torque, $T_{SO}$, on the magnetic moment. The spin-orbit torque on the reference layer 212 is given by $T_{SO}=-\gamma[M \times H_{SO}]$, where M is the magnitude of the magnetic moment of the reference layer 212. The SO torque on the reference layer 212 perturbs the reference layer from an equilibrium state that is aligned or anti-aligned with the magnetic moment of the free layer 216. The magnetic moment of the reference layer 212 exerts a field on the free layer 216 that cants the free layer magnetic moment from its equilibrium position. Stated differently, the free layer magnetic moment is canted away from the stagnation point. A spin transfer current, $J_{STT}$, may be driven perpendicular to plane through the magnetic junction 210. A spin transfer torque may be exerted on the free layer magnetic moment. The magnetic moment of the free layer 216 is thus switched using STT.

In other embodiments, the current $J_{SO}$ is driven in plane through the SO active layer 230. This torque places the reference layers 212 and 220 in the dual state. The free layer 216 may then be written using spin transfer torque. The magnetic moment of the free layer 216 may be written using spin transfer torque. When data is to be read from the magnetic junction 210, the SO current is driven in the opposite direction. The reference layers 212 and 260 are then in the antidual state. The magnetoresistance of the junction 210 may then be read, The magnetic junction 210 may undergo faster switching. Because the SO torque perturbs the magnetic moment of the reference layer 212 and the resulting stray field move the free layer magnetic moment away from the stagnation point, switching using STT torque may be faster. Further, because a dual magnetic junction 210 is used, the spin transfer torque on the free layer 216 may be higher for the reference layers 212 and 220 being in the dual state. A lower switching current may then be driven through the magnetic junction 210. If the reference layers 212 and 220 are in the antidual state, then the magnetoresistance of the junction 210 may be higher. Thus, a higher signal may be obtained. Moreover, in the antidual state the read error rate may be significantly decreased due to reduced STT amplitude at a given current density. Therefore, the sensing margin may increase and requirements on the thermal stability of the cells may be relaxed.

FIGS. 5A-5D depict another exemplary embodiment of a portion of a magnetic memory 300 that includes a dual magnetic junction 310 switched using spin-orbit interaction. For clarity, FIGS. 5A-5D are not to scale. In addition, portions of the magnetic memory 300 such as bit lines, selection devices, word lines, row selectors and column selectors are not shown or not labeled as such. The magnetic memory 300 is analogous to the magnetic memory 200. The magnetic memory 300 thus includes a magnetic storage cell 310 and a line 330 including an SO active layer 330 that are analogous to the magnetic junction 210 and the line 230 having the SO active layer 230 therein. The magnetic storage cell 310 may be one of a number of magnetic storage cells ordered in an array.

The magnetic junction 310 includes a first reference layer 312, a first nonmagnetic spacer layer 314, the data storage/free layer 316, a second nonmagnetic spacer layer 318 and a second reference layer 320 that are analogous to the first reference layer 212, the first nonmagnetic spacer layer 214, the data storage/free layer 216, the second nonmagnetic spacer layer 218 and the second reference layer 220, respectively. The spacer layers 314 and 318 are each nonmagnetic. One or both of the spacer layers 314 and 318 may be an insulating tunneling barrier, such as crystalline MgO. In other embodiments, the spacer layer 314 and/or 318 may be a conductor. In alternate embodiments, the spacer layer 314 and/or 318 might have another structure. The layers 312, 316 and 320 are ferromagnetic and thus include materials such as Co, Ni and/or Fe.

The free layer 316 has a magnetic moment 317 that is switchable. When the magnetic junction 310 is quiescent (not being switched), the magnetic moment 317 of the free layer 316 lies along the easy axis of the free layer 316. In the embodiment shown in FIGS. 5A-5D, the easy axis is in plane. However, in other embodiments, the easy axis may be in another direction including but not limited to perpendicular to plane. In some embodiments, the free layer 316 is a single layer including a ferromagnetic material and/or alloy. In other embodiments, the free layer 316 may be a multilayer including but not limited to a SAF or other structure.

The magnetic junction 310 also includes reference layers 312 and 320 having magnetic moments 313 and 321, respectively. The reference layer(s) 312 and/or 320 may each be a simple layer composed of a ferromagnetic material or may be a multilayer such as a SAF. The magnetic moment 321 of the reference 320 is desired to be fixed, or pinned. In some embodiments, therefore, the magnetic junction 310 may include a pinning layer (not shown in FIGS. 5A-5D) such as an AFM layer that pins the magnetic moment 321 in place. The magnetic moment 313 of the reference layer 312 is fixed for a read current and a spin transfer current driven through the magnetic junction 310. In other embodiments, the magnetic moment 321 may be fixed in another manner. In the embodiment shown, the magnetic moments 313 and 321 are in plane. However, in other embodiments, the magnetic moment(s) 313 and/or 321 may be in another direction including but not limited to perpendicular to plane in some embodiments.

The SO active layer 330 has a strong spin-orbit interaction that may be used in generating a SO field $H_{SO}$. The SO interaction may be from the spin Hall effect, the Rashba effect, another effect and/or some combination thereof. In the embodiment shown, the SO active layer 330 may be the entire line. Thus, the SO active layer 330 may extend over multiple magnetic junctions 310. In other embodiments, the SO active layer 330 may simply be in the region of the magnetic junction 310. This is indicated by dashed lines in the layer 330. In still other embodiments, the SO active layer may reside between the magnetic junction 310 (and thus the reference layer 312) and the word line that carries the in-plane current $J_{SO}$. For simplicity, the reference numeral 330 will be used both for the line and the portions of the line forming the SO active layer. Thus, the SO active layer 330 may include materials analogous to those discussed above for the SO active layers 122 and 230.

In some embodiments, an optional spin diffusion layer (not shown in FIGS. 5A-5D) may reside between the reference layer 312 and the SO active layer 330. However, in other embodiments, as shown in FIGS. 5A-5D, the spin diffusion layer may be omitted.

Figure 5A:
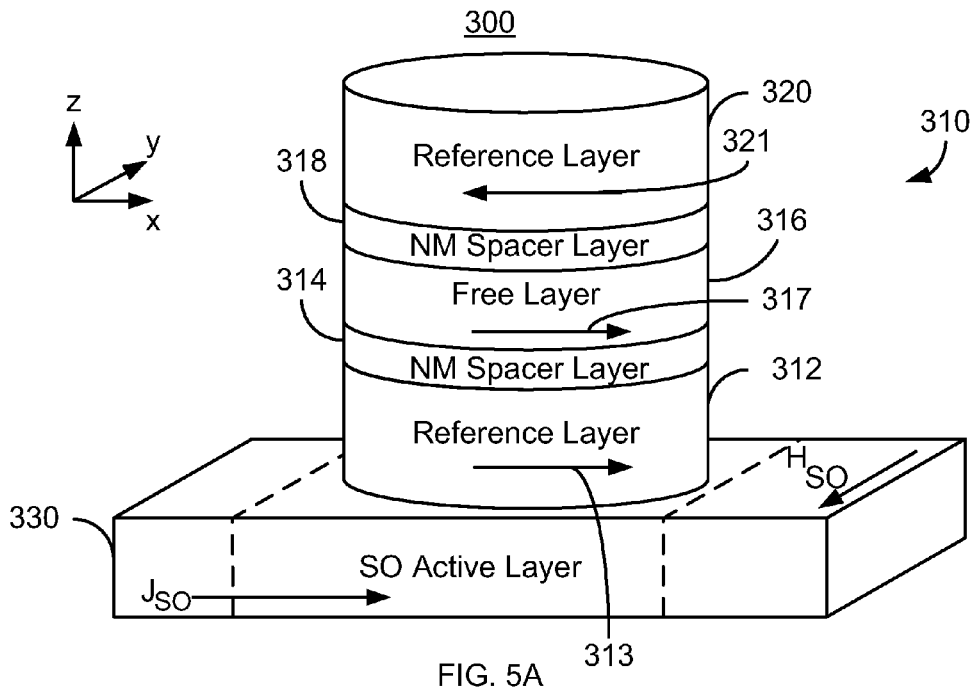
FIGS. 5A-5D depict another exemplary embodiment of a portion of a magnetic memory that includes a dual magnetic junction switched using spin-orbit interaction in switching.
Figure 5B:
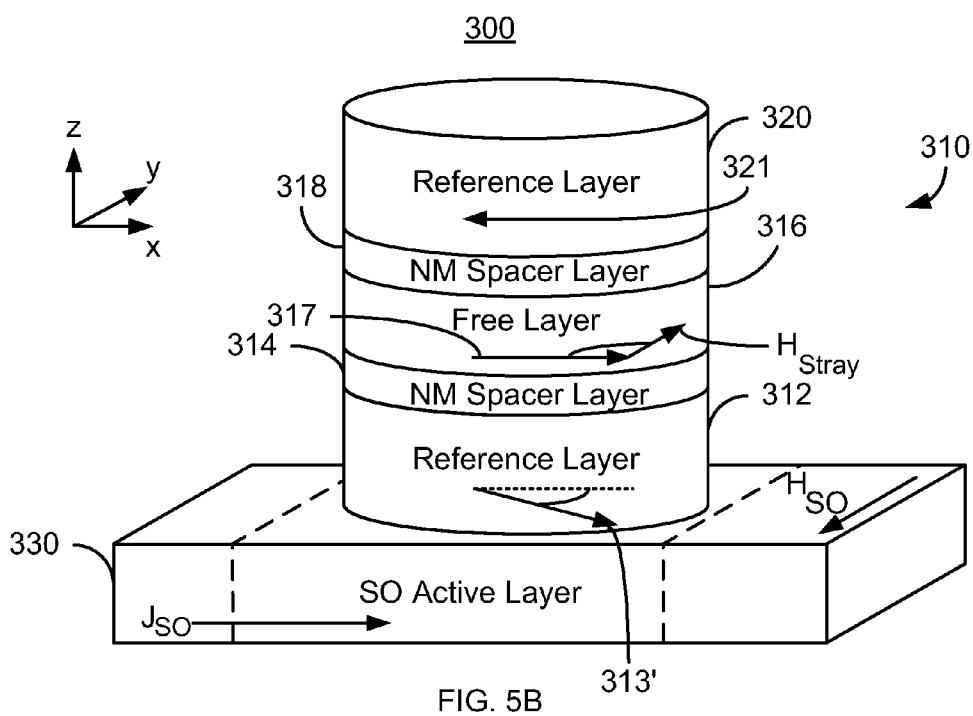
Figure 5C:
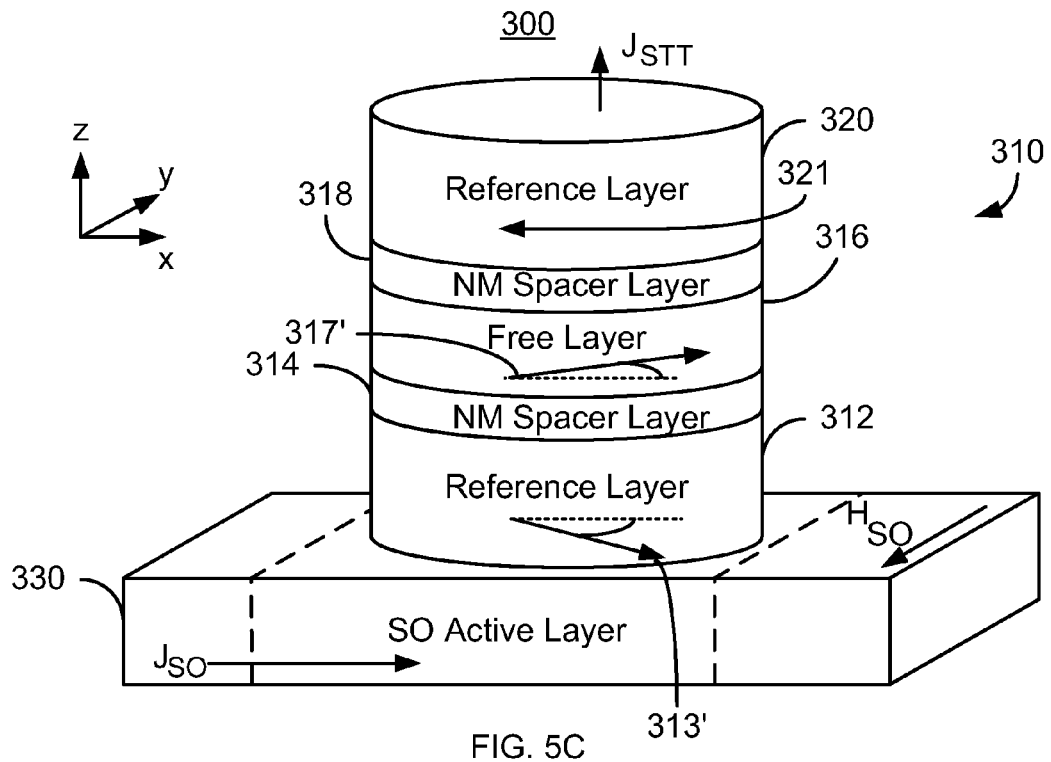
Figure 5D:
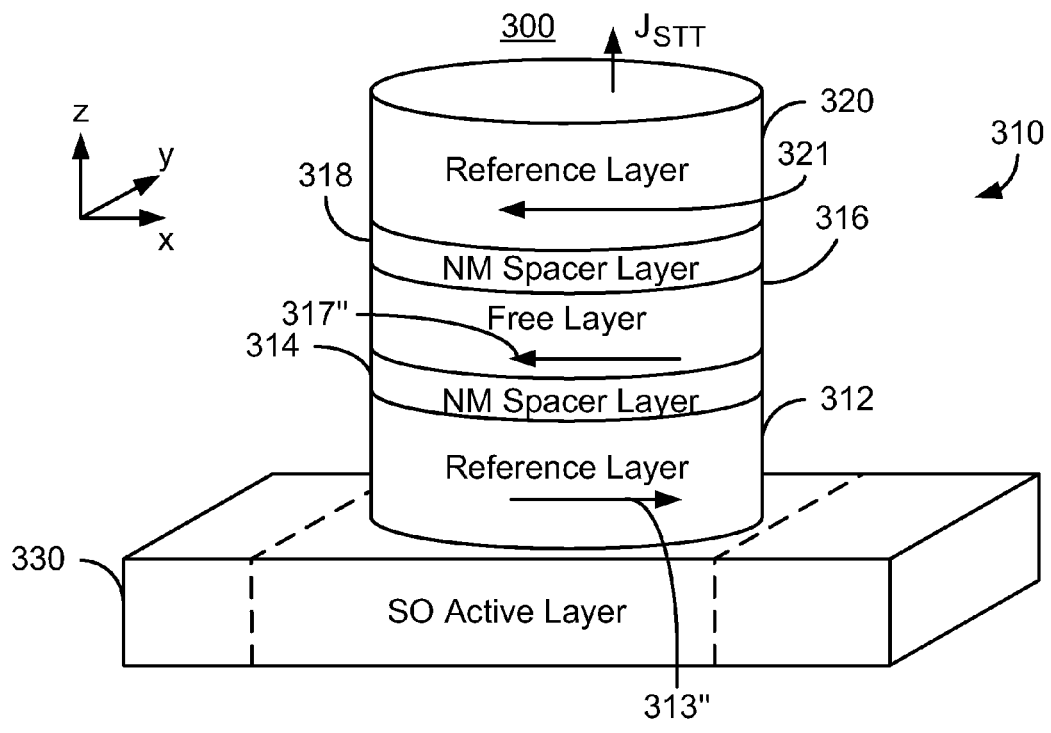

The magnetic moment 313 of the reference layer 312 is configured to be changed using the spin orbit interaction from the SO active layer 330, though generally not due to a spin transfer or read current driven through the magnetic junction 300. This change in magnetic moment occurs during writing of the free layer 316, as shown in FIGS. 5A-5D. As depicted in FIG. 5A, an in-plane current $J_{SO}$ may be driven through the SO active layer 330. This generates a SO field $H_{SO}$. The SO field perturbs the position of the magnetic moment 312. The result is shown in FIG. 5B. The magnetic moment 313' is angled from its previous position. Thus, the magnetic moment 313' of the reference layer 312 is no longer (anti) aligned with the equilibrium position of the magnetic moment 317 of the free layer 316. Consequently, the reference layer 313' exerts a magnetic field, $H_{stray}$, on the free layer magnetic moment 317. The free layer magnetic moment 317 is canted from its equilibrium position by the magnetic field $H_{stray}$. This is depicted in FIG. 5C. The free layer magnetic moment 317' is thus angled from the easy axis shown by the dotted line in the free layer 316. The free layer magnetic moment 317' is canted away from the stagnation point. A spin transfer current, $J_{STT}$, may be driven perpendicular to plane through the magnetic junction 310 as is shown in FIG. 5C. A spin transfer torque may be exerted on the free layer magnetic moment 317'. In addition, the in-plane current $J_{SO}$ may be removed. The magnetic moment of the free layer 316 is thus switched using STT and the reference layer 312 returns to its equilibrium state. This is shown in FIG. 5D. The free layer magnetic moment 317" is thus aligned antiparallel with the magnetic moment 313". This is because for the embodiment shown in FIG. 5A-D the spin transfer torque current is driven away from the line 330. If the spin transfer torque current were driven in the opposite direction, the free layer magnetic moment 317" would be parallel with the magnetic moment 313". In other embodiments the switching direction of the free layer for a given direction spin transfer torque current can be reversed from that which is shown in FIGS. 5A-D.

The magnetic junction 310 may undergo faster switching. Because the SO torque perturbs the magnetic moment 313' of the reference layer 312, the field $Hs_{tray}$ moves the free layer magnetic moment away from the stagnation point. Consequently, switching using STT torque may be faster and with reduced WER. Further, because a dual magnetic junction 310 is used, the spin transfer torque on the free layer 316 may be higher for the magnetic moments 313/313'/313" and 321 of the reference layers 312 and 320 being in the dual state. A lower spin transfer switching current $J_{STT}$ may then be driven through the magnetic junction 310. If the reference layers 312 and 320 are in the antidual state, then the magnetoresistance of the junction 310 may be higher. Thus, a higher signal may be obtained. Moreover, in the antidual state the read error rate may significantly decrease due to reduced STT amplitude at a given current density. Therefore, the sensing margin may increase and requirements on the thermal stability of the cells may be relaxed. Switching between the dual and antidual states is described below for example with respect to FIGS. 8A and 8B.

FIGS. 6A-6D depict another exemplary embodiment of a portion of a magnetic memory 400 that includes a dual magnetic junction 410 switched using spin-orbit interaction. For clarity, FIGS. 6A-6D are not to scale. In addition, portions of the magnetic memory 400 such as bit lines, selection devices, word lines, row selectors and column selectors are not shown or not labeled as such. The magnetic memory 400 is analogous to the magnetic memories 200 and 300. The magnetic memory 400 thus includes a magnetic storage cell 410 and a line 430 including an SO active layer 430 that are analogous to the magnetic junction 210/310 and the line 230/330 having the SO active layer 230/330 therein. The magnetic storage cell 410 may be one of a number of magnetic storage cells ordered in an array.

The magnetic junction 410 includes a first reference layer 412, a first nonmagnetic spacer layer 414, the data storage/free layer 416, a second nonmagnetic spacer layer 418 and a second reference layer 420 that are analogous to the first reference layer 212/312, the first nonmagnetic spacer layer 214/314, the data storage/free layer 216/316, the second nonmagnetic spacer layer 218/318 and the second reference layer 220/320, respectively. The spacer layers 414 and 418 are each nonmagnetic. One or both of the spacer layers 414 and 418 may be an insulating tunneling barrier, such as crystalline MgO. In other embodiments, the spacer layer 414 and/or 418 may be a conductor. In alternate embodiments, the spacer layer 414 and/or 418 might have another structure. The layers 412, 416 and 420 are ferromagnetic and thus include materials such as Co, Ni and/or Fe.

The free layer 416 has a magnetic moment 417 that is switchable. When the magnetic junction 410 is quiescent (not being switched), the magnetic moment 417 of the free layer 416 lies along the easy axis of the free layer 416. In the embodiment shown in FIGS. 6A-6D, the easy axis is perpendicular-to-plane. Thus, the free layer 416 may have a perpendicular anisotropy field that exceeds its out-of-plane demagnetization field (typically a significant fraction of $4\pi M_s$). However, in other embodiments, the easy axis may be in another direction including but not limited to in plane. In some embodiments, the free layer 416 is a single layer including a ferromagnetic material and/or alloy. In other embodiments, the free layer 416 may be a multilayer including but not limited to a SAF or other structure.

The magnetic junction 410 also includes reference layers 412 and 420 having magnetic moments 413 and 421, respectively. The reference layer(s) 412 and/or 420 may each be a simple layer composed of a ferromagnetic material or may be a multilayer such as a SAF. The magnetic moment 421 of the reference 420 is desired to be fixed, or pinned. The magnetic moment 413 of the reference layer 412 is fixed for a read current and a spin transfer current driven through the magnetic junction 410. In the embodiment shown, the magnetic moments 413 and 421 are perpendicular plane. Thus, the reference layers 412 and 416 may each have a perpendicular anisotropy field that exceeds its out-of-plane demagnetization field (typically a significant fraction of $4\pi M_s$). However, in other embodiments, the magnetic moment(s) 413 and/or 421 may be in another direction including but not limited to in plane in some embodiments.

The SO active layer 430 has a strong spin-orbit interaction that may be used in generating a SO field $H_{SO}$. The SO interaction may be from the spin Hall effect, the Rashba effect, another effect and/or some combination thereof. In the embodiment shown, the SO active layer 430 may be the entire line. Thus, the SO active layer 430 may extend over multiple magnetic junctions 410. In other embodiments, the SO active layer 430 may simply be in the region of the magnetic junction 410. This is indicated by dashed lines in the layer 430. In still other embodiments, the SO active layer may reside between the magnetic junction 410 (and thus the reference layer 412) and the word line that carries the in-plane current $J_{SO}$. For simplicity, the reference numeral 430 will be used both for the line and the portions of the line forming the SO active layer. Thus, the SO active layer 430 may include materials analogous to those discussed above for the SO active layers 122, 230 and 330.

In some embodiments, an optional spin diffusion layer (not shown in FIGS. 6A-6D) may reside between the reference layer 412 and the SO active layer 430. However, in other embodiments, as shown in FIGS. 6A-6D, the spin diffusion layer may be omitted.

Figure 6A:
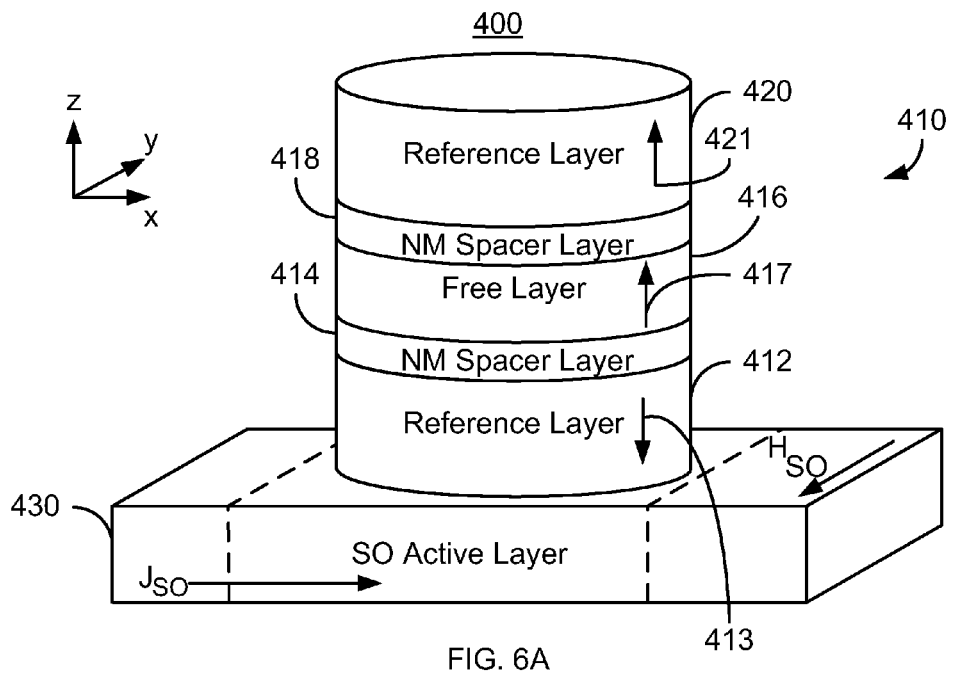
FIGS. 6A-6D depict another exemplary embodiment of a portion of a magnetic memory that includes a dual magnetic junction switched using spin-orbit interaction in switching
Figure 6B:
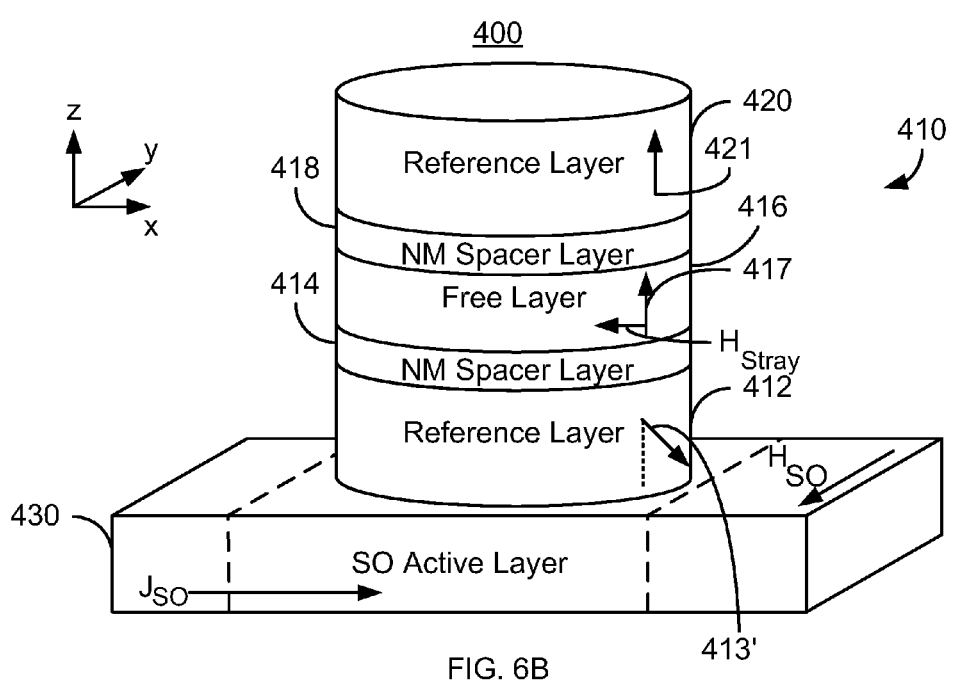
Figure 6C:
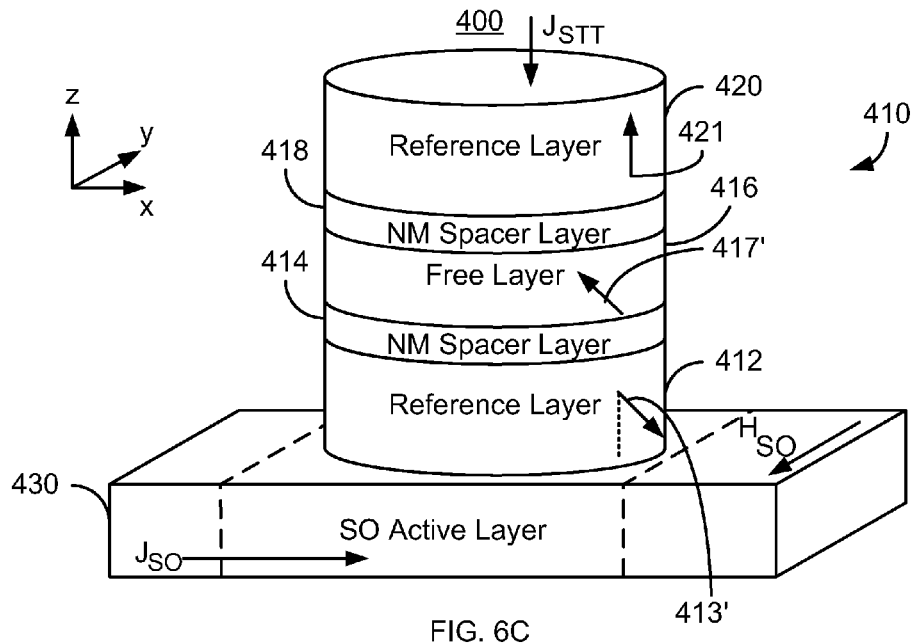
Figure 6D:
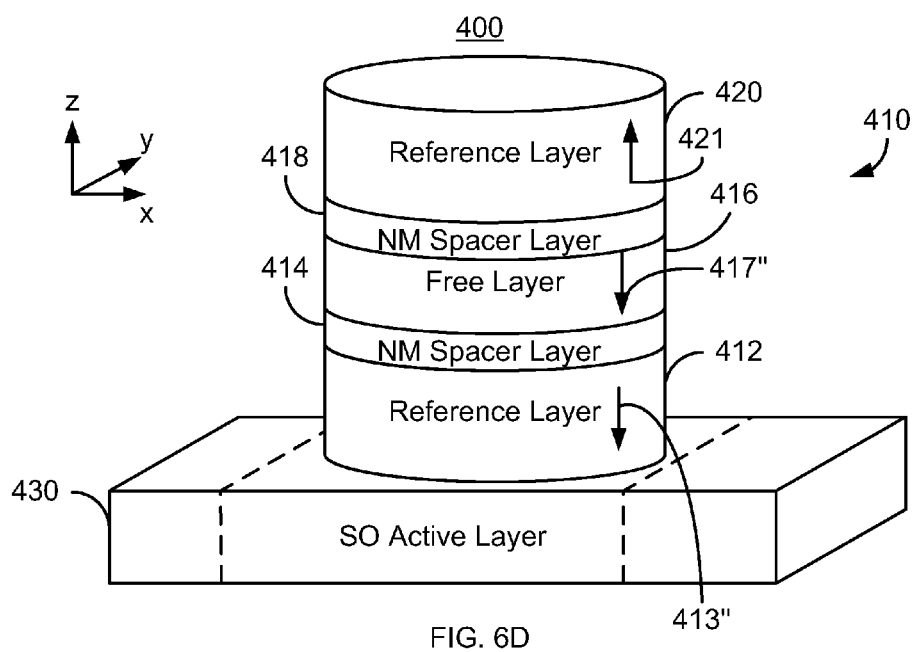

The magnetic moment 413 of the reference layer 412 is configured to be changed using the spin orbit interaction from the SO active layer 430. However, as discussed above, the magnetic moment 413 would be stable for a read current or spin transfer current driven through the magnetic junction 400, perpendicular-to-plane. The change in the magnetic moment 413 occurs during writing of the free layer 416, as shown in FIGS. 6A-6D. As depicted in FIG. 6A, an in-plane current $J_{SO}$ may be driven through the SO active layer 430. This generates a SO field $H_{SO}$. The SO field perturbs the position of the magnetic moment 412. The result is shown in FIG. 6B. The magnetic moment 413' is angled from its previous position. The magnetic moment 413' now has a component in plane. Thus, the magnetic moment 413' of the reference layer 412 is no longer (anti)aligned with the equilibrium position of the magnetic moment 417 of the free layer 416. Consequently, the reference layer 413' exerts a magnetic field, $H_{stray}$, on the free layer magnetic moment 417. The free layer magnetic moment 417 is canted from its equilibrium position by the magnetic field $H_{stray}$. This is depicted in FIG. 6C. The free layer magnetic moment 417' is thus angled from the easy axis shown by the dotted line in the free layer 416. The free layer magnetic moment 417' has a component in plane. Further, the free layer magnetic moment 417' is canted away from the stagnation point. A spin transfer current, $J_{STT}$, may be driven perpendicular to plane through the magnetic junction 410 as is shown in FIG. 6C. A spin transfer torque may be exerted on the free layer magnetic moment 417'. In addition, the in-plane current $J_{SO}$ may be removed. The magnetic moment of the free layer 416 is thus switched using STT and the reference layer 412 returns to its equilibrium state. This is shown in FIG. 6D. The free layer magnetic moment 417" is thus aligned parallel with the magnetic moment 413". This is because the spin transfer torque current is driven toward the line 430. If the spin transfer torque current were driven in the opposite direction, the free layer magnetic moment 417" would be antiparallel with the magnetic moment 413". In other embodiments the switching direction of the free layer for a given direction spin transfer torque current can be reversed to what is shown in FIGS. 6A-D.

The magnetic junction 410 may undergo faster switching. Because the SO torque perturbs the magnetic moment 413' of the reference layer 412, the field $Hs_{tray}$ moves the free layer magnetic moment away from the stagnation point. Consequently, switching using STT torque may be faster and with reduced WER. Further, because a dual magnetic junction 410 is used, the spin transfer torque on the free layer 416 may be higher for the magnetic moments 413/413'/413" and 421 of the reference layers 412 and 420 being in the dual state. A lower spin transfer switching current $J_{STT}$ may then be driven through the magnetic junction 410. If the reference layers 412 and 420 are in the antidual state, then the magnetoresistance of the junction 410 may be higher. Thus, a higher signal may be obtained. Moreover, in the antidual state the read error rate may significantly decrease due to reduced STT amplitude at a given current density. Therefore, the sensing margin may increase and requirements on the thermal stability of the cells may be relaxed. Switching between the dual and antidual states is described below for example with respect to FIGS. 8A and 8B.

Figure 7A:
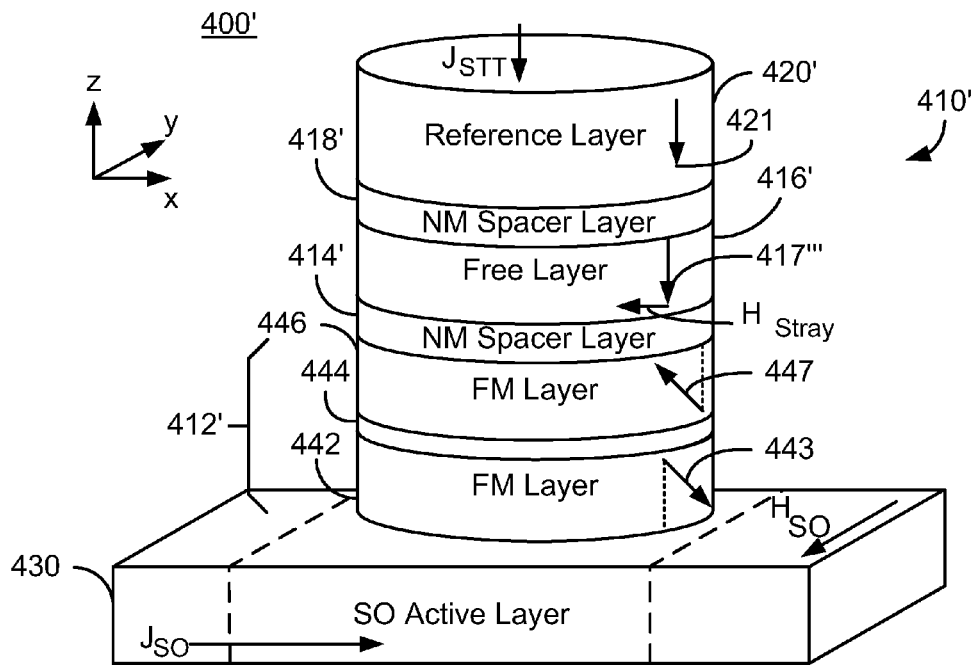
FIGS. 7A-7B depicts another exemplary embodiment of a portion of a magnetic memory that includes a dual magnetic junction switched using spin-orbit interaction in switching.
Figure 7B:
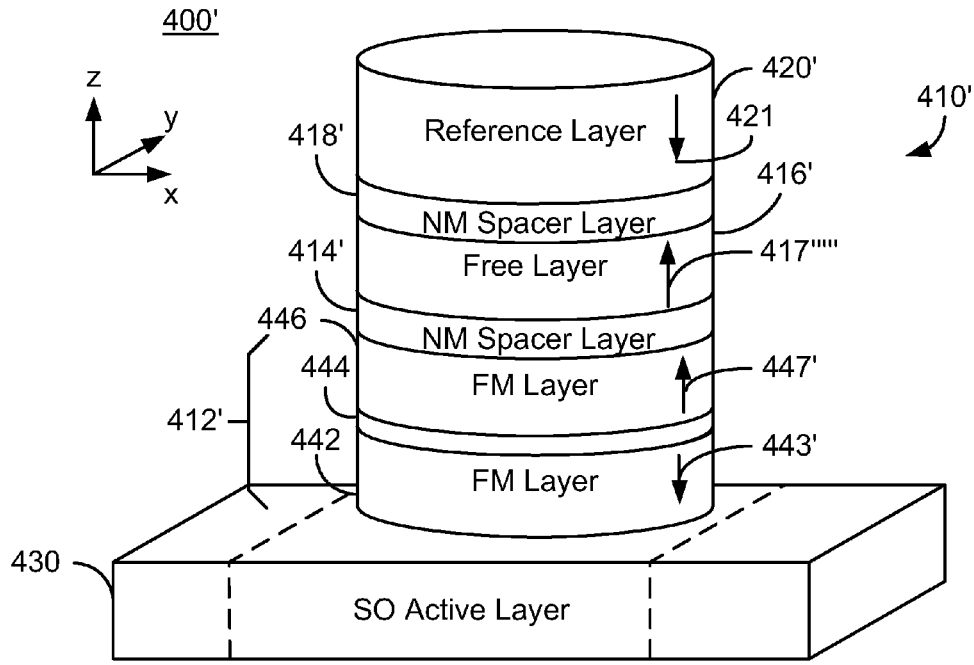

FIGS. 7A-7B depict another exemplary embodiment of a portion of a magnetic memory 400' that includes a dual magnetic junction 410' switched using spin-orbit interaction. For clarity, FIGS. 7A-7B are not to scale. In addition, portions of the magnetic memory 400' such as bit lines, selection devices, word lines, row selectors and column selectors are not shown or not labeled as such. The magnetic memory 400' is analogous to the magnetic memories 200, 300 and 400. The magnetic memory 400' thus includes a magnetic storage cell 410' and a line 430' including an SO active layer 430' that are analogous to the magnetic junction 210/310/410 and the line 230/330/430 having the SO active layer 230/330/430 therein. The magnetic storage cell 410' may be one of a number of magnetic storage cells ordered in an array. The SO active layer may make up the entire bus or reside only in proximity to the magnetic junction 410'. This is indicated by the dashed lines in the common line/SO active layer 430'. For simplicity, the reference numeral 430' will be used both for the line and the portions of the line forming the SO active layer.

The magnetic junction 410' includes a first reference layer 412', a first nonmagnetic spacer layer 414', the data storage/free layer 416', a second nonmagnetic spacer layer 418' and a second reference layer 420' that are analogous to the first reference layer 212/312/412, the first nonmagnetic spacer layer 214/314/414, the data storage/free layer 216/316/416, the second nonmagnetic spacer layer 218/318/418 and the second reference layer 220/320/420, respectively. Although the layers 414' and 420' are shown as simple layers, one or both of the layers 414' and 420' may be a multilayer including but not limited to a SAF.

In the embodiment shown, the reference layer 412' is a SAF including ferromagnetic layers 442 and 446 separated by a nonmagnetic layer 444, such as Ru. Each ferromagnetic layer 442 and 446 has a magnetic moment 443 and 447. The layers 412', 416' and 420' are depicted as having their magnetic moments perpendicular to plane. However, in another embodiment, the magnetic moment(s) may be in plane. In some embodiments, an optional spin diffusion layer (not shown in FIGS. 7A-7B) may reside between the reference layer 412' and the SO active layer 430'. However, in other embodiments, as shown in FIGS. 7A-7B, the spin diffusion layer may be omitted.

The magnetic moments 443 and 447 of the reference layer 412' are configured to be changed using the spin orbit interaction from the SO active layer 430, though not for a read current or spin transfer current driven perpendicular-to-plane through the magnetic junction 400'. As depicted in FIG. 7A, an in-plane current $J_{SO}$ may be driven through the SO active layer 430'. This generates a SO field $H_{SO}$. The SO field perturbs the position of the magnetic moment 443. Because they are antiferromagnetically coupled, the magnetic moment 447 is also canted from perpendicular to plane, as is shown in FIG. 7A The magnetic moments 443 and 447 of the reference layer 412' are no longer aligned and anti-aligned, respectively, with the equilibrium position of the magnetic moment 417''' of the free layer 416'. Consequently, the reference layer 412' exerts a magnetic field, $H_{stray}$, on the free layer magnetic moment 417'''. Note that in some embodiments, the magnitudes of the magnetic moments 443 and 447 are desired to be imbalanced in order to increase the magnitude of the field $H_{stray}$. The free layer magnetic moment 417''' will be canted from its equilibrium position by the magnetic field $H_{stray}$. Thus, the free layer magnetic moment 417''' will canted away from the stagnation point. A spin transfer current, $J_{STT}$, may be driven perpendicular to plane through the magnetic junction 410' as is shown in FIG. 7A. A spin transfer torque may be exerted on the free layer magnetic moment 417'''. In addition, the in-plane current $J_{SO}$ may be removed. The magnetic moment of the free layer 416' is thus switched using STT and the reference layer 412' returns to its equilibrium state. This is shown in FIG. 7B. The free layer magnetic moment 417'''' for the embodiment shown in FIG. 7A-B is thus aligned parallel with the magnetic moment 447'. This is because the spin transfer torque current is driven toward the line 430. If the spin transfer torque current were driven in the opposite direction, the free layer magnetic moment 417'''' would be antiparallel with the magnetic moment 447'. In other embodiments the switching direction of the free layer for a given direction spin transfer torque current may be reversed from what is shown in FIGS. 7A-B.

The magnetic junction 410' may undergo faster switching. Because the SO torque perturbs the magnetic moments 443 and 447 of the reference layer 412', the field $Hs_{tray}$ moves the free layer magnetic moment 417''' away from the stagnation point. Consequently, switching using STT torque may faster. Further, because a dual magnetic junction 410' is used, the spin transfer torque on the free layer 416' may be higher for the reference layers 412' and 420' being in the dual state. A lower spin transfer switching current $J_{STT}$ may then be driven through the magnetic junction 410'. If the reference layers 412' and 420' are in the antidual state, then the magnetoresistance of the junction 410' may be higher. Thus, a higher signal may be obtained. Moreover, in the antidual state the read error rate may significantly decrease due to reduced STT amplitude at a given current density. Therefore, the sensing margin may increase and requirements on the thermal stability of the cells may be relaxed. Switching between the dual and antidual states is described below for example with respect to FIGS. 8A and 8B.

Figure 8A:
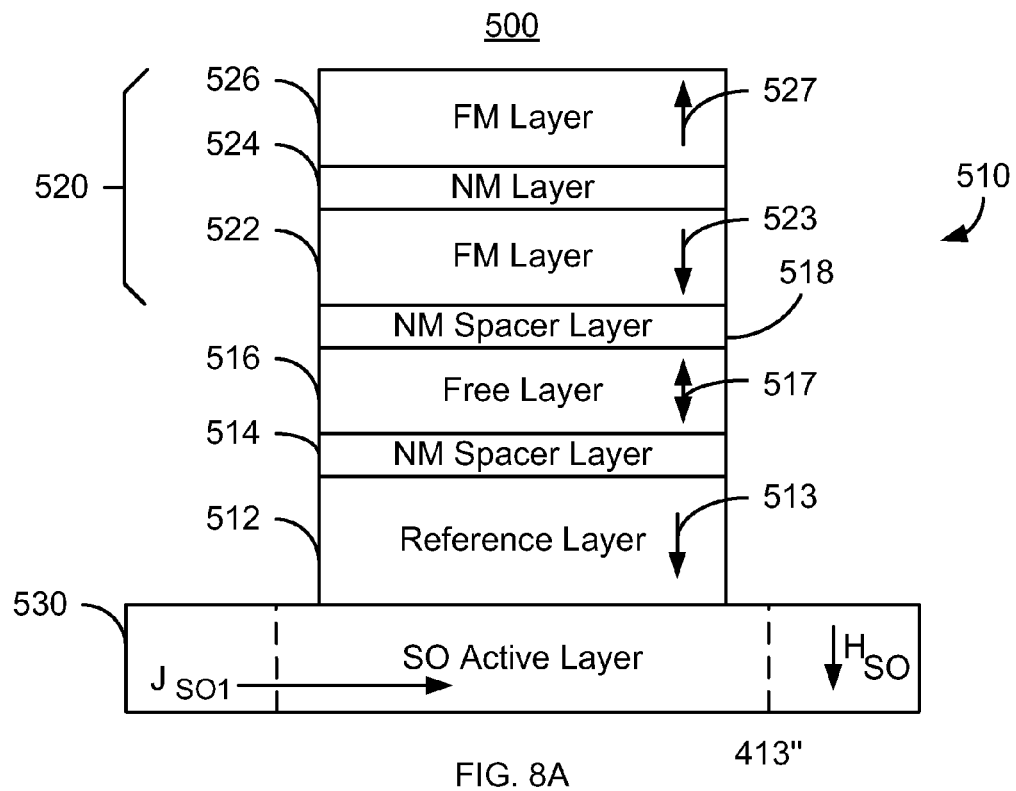
FIGS. 8A-8B depicts another exemplary embodiment of a portion of a magnetic memory that includes a dual magnetic junction switched using spin-orbit interaction in switching
Figure 8B:
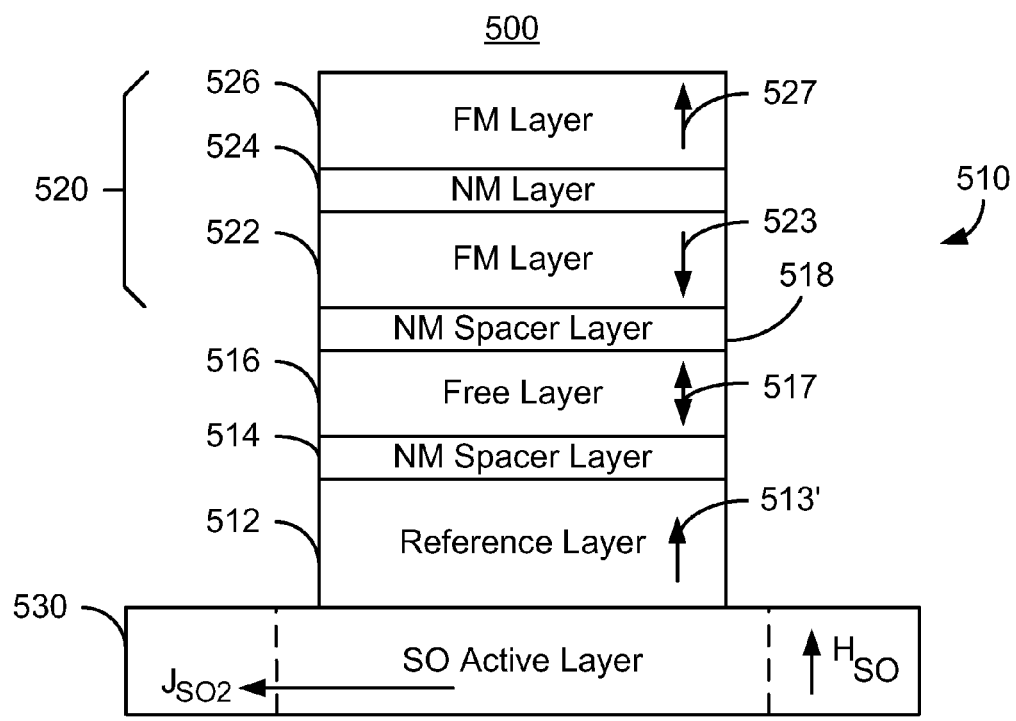

FIGS. 8A-8B depicts another exemplary embodiment of a portion of a magnetic memory 500 that includes a dual magnetic junction 510 switched using spin-orbit interaction during switching. For clarity, FIGS. 8A-8B are not to scale. In addition, portions of the magnetic memory 500 such as bit lines, selection devices, word lines, row selectors and column selectors are not shown or not labeled as such. The magnetic memory 500 is analogous to the magnetic memories 200, 300, 400 and 400'. The magnetic memory 500 thus includes a magnetic storage cell 510 and a line 530 including an SO active layer 530 that are analogous to the magnetic junction 210/310/410/410' and the line 230/330/430/430' having the SO active layer 230/330/430/430' therein. The magnetic storage cell 510 may be one of a number of magnetic storage cells ordered in an array. For simplicity, the reference numeral 530 will be used both for the line and the portions of the line forming the SO active layer.

The magnetic junction 510 includes a first reference layer 512, a first nonmagnetic spacer layer 514, the data storage/free layer 516, a second nonmagnetic spacer layer 518 and a second reference layer 520 that are analogous to the first reference layer 212/312/412/412', the first nonmagnetic spacer layer 214/314/414/414', the data storage/free layer 216/316/416/416', the second nonmagnetic spacer layer 218/318/418/418' and the second reference layer 220/320/420/420', respectively. The spacer layers 514 and 518 are each nonmagnetic. One or both of the spacer layers 514 and 518 may be an insulating tunneling barrier, such as crystalline MgO. In other embodiments, the spacer layer 514 and/or 518 may be a conductor. In alternate embodiments, the spacer layer 514 and/or 518 might have another structure. The layers 512, 516 and 520 are ferromagnetic and thus include materials such as Co, Ni and/or Fe.

The free layer 516 has a magnetic moment 517 that is switchable. When the magnetic junction 510 is quiescent (not being switched), the magnetic moment 517 of the free layer 516 lies along the easy axis of the free layer 516. In the embodiment shown in FIGS. 8A-8B, the easy axis is perpendicular-to-plane. Thus, the free layer 516 may have a perpendicular anisotropy field that exceeds its out-of-plane demagnetization field (typically a significant fraction of $4\pi M_s$). However, in other embodiments, the easy axis may be in another direction including but not limited to in plane. In some embodiments, the free layer 516 is a single layer including a ferromagnetic material and/or alloy. In other embodiments, the free layer 516 may be a multilayer including but not limited to a SAF or other structure.

The SO active layer 530 has a strong spin-orbit interaction that may be used in generating a SO field $H_{SO}$. The SO interaction may be from the spin Hall effect, the Rashba effect, another effect and/or some combination thereof. In the embodiment shown, the SO active layer 530 may be the entire line. Thus, the SO active layer 530 may extend over multiple magnetic junctions 510. In other embodiments, the SO active layer 530 may simply be in the region of the magnetic junction 510. This is indicated by dashed lines in the layer 530. In still other embodiments, the SO active layer may reside between the magnetic junction 510 (and thus the reference layer 512) and the word line that carries the in-plane current $J_{SO}$. Thus, the SO active layer 530 may include materials analogous to those discussed above for the SO active layers 122, 230, 330, 430 and 430'.

In some embodiments, an optional spin diffusion layer (not shown in FIGS. 8A-8B) may reside between the reference layer 512 and the SO active layer 530. However, in other embodiments, as shown in FIGS. 8A-8B, the spin diffusion layer may be omitted.

The magnetic junction 510 also includes reference layers 512 and 520. The reference layer 520 includes ferromagnetic layers 522 and 526 separated by nonmagnetic layer 254. The ferromagnetic layers 522 and 526 have magnetic moments 523 and 527, respectively. Thus, the reference layer 520 may be a SAF. The reference layer 512 is, however, a simple layer having a magnetic moment 513. In other embodiments, the reference layer may be a multilayer. The magnetic moments 523 and 527 of the reference 520 are desired to be fixed, or pinned. However, the magnetic moment 513 of the reference layer 512 is desired to be changeable. In particular, the reference layer 512 is desired to be switchable between the antidual state depicted in FIG. 8A and the dual state depicted in FIG. 8B. The antidual state is used for reading, while the dual state is used for writing.

The magnetic moment 513 of the reference layer 512 is configured to be changed using the spin orbit interaction from the SO active layer 530. The change in the magnetic moment 513 occurs for writing or reading of the free layer 516. As depicted in FIG. 8A, an in-plane current $J_{SO}$ may be driven through the SO active layer 530. This generates a SO field, $H_{SO}$. In order to switch the magnetic moment 513 of the reference layer 512 which is perpendicular to plane, the SO field is also essentially perpendicular to plane. If, however, the magnetic moment 513 were in plane, the SO field is essentially in plane. The SO field perturbs the position of the magnetic moment 513. For reading, the in-plane current $J_{SO1}$ is driven in the direction that generates an SO field for the dual antidual state, shown in FIG. 8A. Thus the magnetic moment 513 is switched to be in the antidual state. The magnetic junction 510 may then be read. For writing, the in-plane current $J_{SO2}$ is driven in the opposite direction, generating an SO field in the opposite direction. Consequently, the magnetic moment 513' is switched to the dual state. The magnetic junction 510 may then be written using spin transfer torque.

In some embodiments, the magnetic moment 513 of the reference layer 512 is stable in the dual and antidual states in the absence of the SO field/SO torque. Stated differently, the magnetic moment 513 is stable aligned parallel or antiparallel to the easy axis of the free layer 516. Thus, the reference layer 512 has some anisotropy perpendicular to plane. In such embodiments, the SO current may be reduced or removed during reading and writing. In other embodiments, the magnetic moment 513 of the reference layer 512 is not stable in the absence of the SO field/SO torque. In such embodiments, the SO current remains on during reading and writing.

For the magnetic junction 510, writing may be performed using spin transfer torque assisted by the stray field from the reference layer 512. In some embodiments, when the magnetic layer 512 is switching from the antidual to dual state or vice versa, it exerts a sufficiently large stray field on the free layer 516 to move the magnetic moment 517 away from the stagnation point. In some other embodiments, the magnetic moment 513 may be canted from parallel/antiparallel to the magnetic moment 517 of the free layer 516. For example, if the magnetic moment 513/513' is only stable when the SO torque is applied, the SO current may be reduced to allow the magnetic moment 513/513' to cant from the positions shown in FIGS. 8A and 8B. In such embodiments, the canted magnetic moment 513/513' may also result in a stray field at the free layer that moves the magnetic moment 517 away from the stagnation point. The magnetic junction 510 may be written in a manner analogous to the magnetic junctions 200, 300, 400 and 400'. In such embodiments, the magnetic moment 513/513' of the reference layer 512 should be sufficiently large. For example, the averaged saturation of magnetization of the reference layer 512 for such embodiments can be 700-1200 emu/cm$^3$. However, in other embodiments, the magnetic junction 510 may be written in another manner. For example, the magnetic junction 510 may be written using only conventional spin transfer torque. In such embodiments, the magnetic moment 513/513' would be switched first, prior to the free layer magnetic moment 517 being switched for example using spin transfer torque. In such embodiments, it may be desirable to reduce the magnetic moment of the reference layer 512 because the static and dynamic stray fields exerted by the magnetic moment 513 on the free layer 516 may result in reduced thermal stability of the magnetic moment 517. In some embodiments, therefore, the averaged magnetization of saturation may be between 0 and 500 emu/cm$^3$. In order to achieve such low magnetic moments, in some embodiments, the reference layer 512 can be made of a SAF with completely compensated or partially compensated magnetic moments of its two magnetic layers. Furthermore, in order to reduce static stray fields exerted by the magnetic moment 513 on the free layer 516, in some embodiments the magnetic moment 513 can be made so that its quiescent state is perpendicular to the easy axis of the magnetic moment 517 of the free layer 516. For example, if the magnetic moment 517 is perpendicular to the plane like depicted in FIG. 8A-D, the magnetic moment 513 of the reference layer 512 can be made in-plane (not shown). If the magnetic moment 517 is in-plane, than the magnetic moment 513 can be made perpendicular to the plane or in-plane with its easy axis perpendicular to the easy axis of the free layer 516 (not shown).

In embodiments in which the SO torque is used to cant the magnetic moment 513/513' from being parallel or antiparallel to the free layer magnetic moment 517, the magnetic junction 510 may enjoy the benefits of the magnetic junctions 210, 310, 410 and/or 410'. For example, the magnetic junction 510 may undergo faster switching. The magnetic junction 510 may also be in the dual or antidual state as desired. Because a dual magnetic junction 510 is used in the dual state for writing, the spin transfer torque on the free layer 516 may be higher. A lower spin transfer switching current $J_{STT}$ may then be driven through the magnetic junction 510. Because the reference layers 512 and 520 are in the antidual state for reading, the magnetoresistance of the junction 510 may be higher. Thus, a higher signal may be obtained. Moreover, in the antidual state the read error rate may significantly decrease due to reduced STT amplitude at a given current density. Therefore, the sensing margin may increase and requirements on the thermal stability of the cells may be relaxed. Although switching between the dual and antidual states is shown for a magnetic junction 510 having perpendicular to plane magnetic moments, such switching may be achieved for other configurations including but not limited to in-plane magnetic moments. Thus, performance of the magnetic junction may be enhanced.

Figure 9:
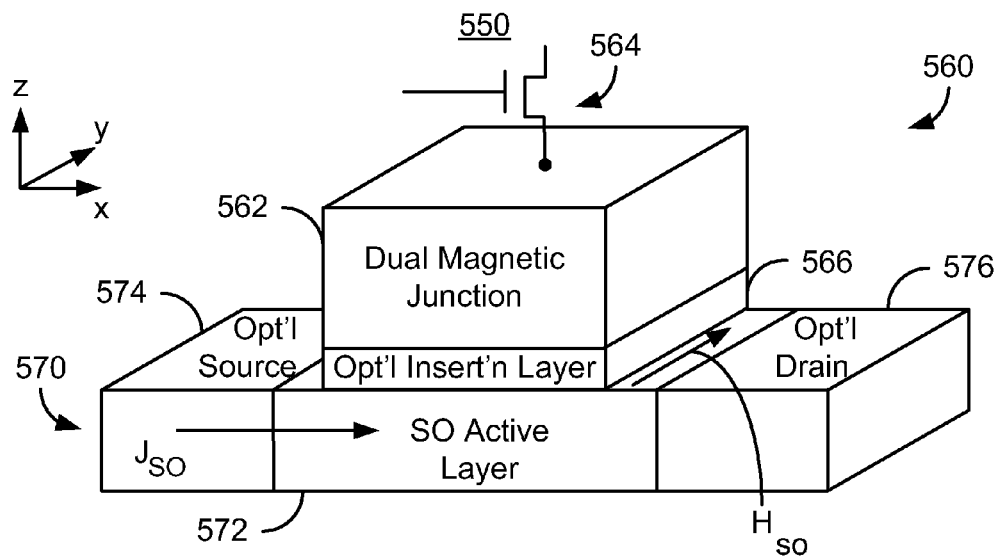
FIG. 9 depicts another exemplary embodiment of a portion of a magnetic memory that includes a dual magnetic junction switched using spin-orbit interaction.

FIG. 9 depicts another exemplary embodiment of a magnetic memory 550 employing a magnetic junction 562 using the spin-orbit interaction to change the magnetic moment of the reference layer. For clarity, FIG. 9 is not to scale. The magnetic memory 550 is analogous to the magnetic memories 200, 300, 400, 400' and/or 500. The magnetic memory 550 thus includes a magnetic junction 562 and a SO active layer 570 that are analogous to the magnetic junctions 210, 310, 410, 410', and/or 510 and the SO active layer 230, 330, 430, 430' and/or 530, respectively. The magnetic junction 562 is thus a dual magnetic junction. Thus, the structure and function of the components 562 and 570 are analogous to that described above for the components 210/310/410/510'/510 and 230/330/430/430'/530, respectively. For example, the magnetic layers may have an easy axis in plane or perpendicular to plane. The reference layers may also have their magnetic moments in plane or perpendicular to plane. The magnetic junction 562 may be switched using spin-orbit interaction for controlling the magnetic moment of the reference layer along with spin transfer torque for switching the free layer, as described above.

In addition to the magnetic junction 566, the magnetic memory 550 includes a selection device 564 corresponding to each magnetic junction 562 in a storage cell 560. In the embodiment shown, a memory cell includes a magnetic junction 562 and a selection device 564. The selection device 564 is a transistor and may be coupled with a bit line. In the embodiment shown, magnetic memory 550 may also include an optional spin diffusion insertion layer 566. The optional spin diffusion layer 566 for some embodiments is a metal. In other embodiments, however, this layer can be a thin insulating material, e.g. crystalline MgO or other oxide or other insulating layer. The resistance-area (RA) of such layer should be small, e.g. smaller than 2 Ohm-μm$^2$. In other embodiments, the optional spin-diffusion layer 566 can be a multilayer including of two or more layers of different materials. The optional spin diffusion insertion layer 566 may be used to diminish the contribution to the spin-orbit field analogous to the Rashba effect or/and to enhance the contribution to the spin-orbit field analogous to the spin Hall effect. The optional spin diffusion insertion layer 566 may also be used to provide an improved seed layer for the reference layer.

Although only one magnetic junction 562 is shown in FIG. 9, the SO active layer 572 may extend over multiple magnetic junctions. Thus, the SO active layer 572 may also function as a word line 570. Further, the SO active layer 572 is shown as having a substantially constant thickness (dimension in the z-direction) and width (dimension in the y-direction). In some embodiments, the thickness and/or width of the SO active layer are reduced at least under the magnetic junction 562. In such embodiments, the spin-orbit current density is increased in the region of the magnetic junction 572. Thus, switching using spin-orbit interaction may be improved. In some embodiments, the SO active layer 572 may be part of a transistor including optional source 574 and optional drain 576. However, in other embodiments, such structures may be omitted.

The magnetic memory 550 shares the benefits of the magnetic memories 200, 300, 400, 400' and/or 500. Because the spin-orbit torque is used in switching the magnetic moment of the free layer, performance of the memory 550 may be improved. Because the SO current is in-plane for the SO active layer 572, the current density $J_{SO}$ may be large. Further, the magnetic junction 562 may be a dual magnetic junction. Thus, a greater magnetoresistance and/or higher spin transfer torque may be achieved. Thus, performance of the memory 550 may be improved.

Figure 10:
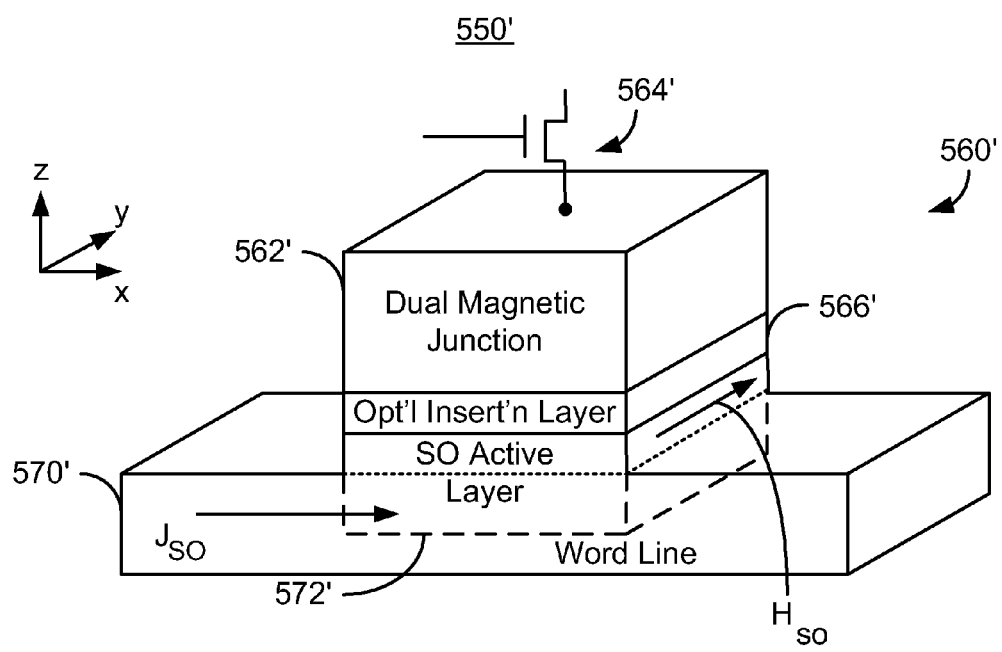
FIG. 10 depicts another exemplary embodiment of a portion of a magnetic memory that includes a dual magnetic junction switched using spin-orbit interaction.

FIG. 10 depicts an exemplary embodiment of a magnetic memory 550' employing a magnetic junction 562' switched using spin-orbit interaction to change the magnetic moment of the reference layer. For clarity, FIG. 10 is not to scale. The magnetic memory 550' is analogous to the magnetic memories 200, 300, 400, 400' and/or 500. The magnetic memory 550' thus includes a magnetic junction 562' and a SO active layer 572' that are analogous to the magnetic junction 210/310/410/410'/510 and the SO active layer 230/330/430/430'/530, respectively. Thus, the structure and function of the components 562' and 572' are analogous to that described above for the components 210/310/410/410'/510 and 230/330/430/430'/530, respectively. For example, the magnetic layers may have their magnetic moment(s) in plane or perpendicular to plane. The reference layer closest to the SO active layer 572 may also have its magnetic moment that is changeable due to a spin orbit field. The magnetic junction 562' may be switched using spin-orbit interaction to change the magnetic moment of the reference layer and spin transfer torque to write to the free layer, as described above. The magnetic memory 550' may also include an optional spin diffusion insertion layer 566' analogous to the optional spin diffusion insertion layer 566. For simplicity, the SO field is shown in the y-direction. However, the SO field may be in another direction including but not limited to perpendicular to plane (e.g. in the positive or negative z direction).

The magnetic memory 550' also includes a word line 570. The word line 570 extends over multiple magnetic junctions 562' and, therefore, multiple memory cells. The SO active layer 572' is electrically coupled with the word line, but is localized in the region of a single magnetic junction 562'. Thus, in the embodiment shown, each SO active layer 572' corresponds to a magnetic junction 562'. In the embodiment shown, the SO active layer 572' extends above the word line 570. However, in other embodiments, the top of the SO active layer 572' may be at another location including but not limited to substantially even with the top of the word line 570. In the embodiment shown, the bottom of the SO active layer 572' is within the word line 570. Thus, the SO active layer 572' may reside in a depression within the word line 570. However, in other embodiments, the bottom of the SO active layer 572' may be at another location. Alternatively, the SO active layer 572' may have a thickness that is less than or equal to that of the word line 570 and reside in an aperture in the word line. In such embodiments, the current density through the SO active layer 572' may be greater than in the surrounding word line 570. The SO active layer 572' is also shown as extending to the edges of the magnetic junction 562'. However, in other embodiments, the SO active layer 572' may extend further than the magnetic junction 562' in the x-y plane.

The magnetic memory 550' shares the benefits of the magnetic memories 200, 300, 400, 400', 500 and 550. Because the spin-orbit torque is used in changing the magnetic moment reference layer closest to the SO active layer 572', performance of the memory 550' may be improved. Because the SO current is in-plane for the SO active layer 572', the current density $J_{SO}$ may be large. Further, the magnetic junction 562' may be a dual magnetic junction having enhanced spin transfer torque and/or magnetoresistance. Thus, performance of the memory 550' may be improved.

Figure 11:
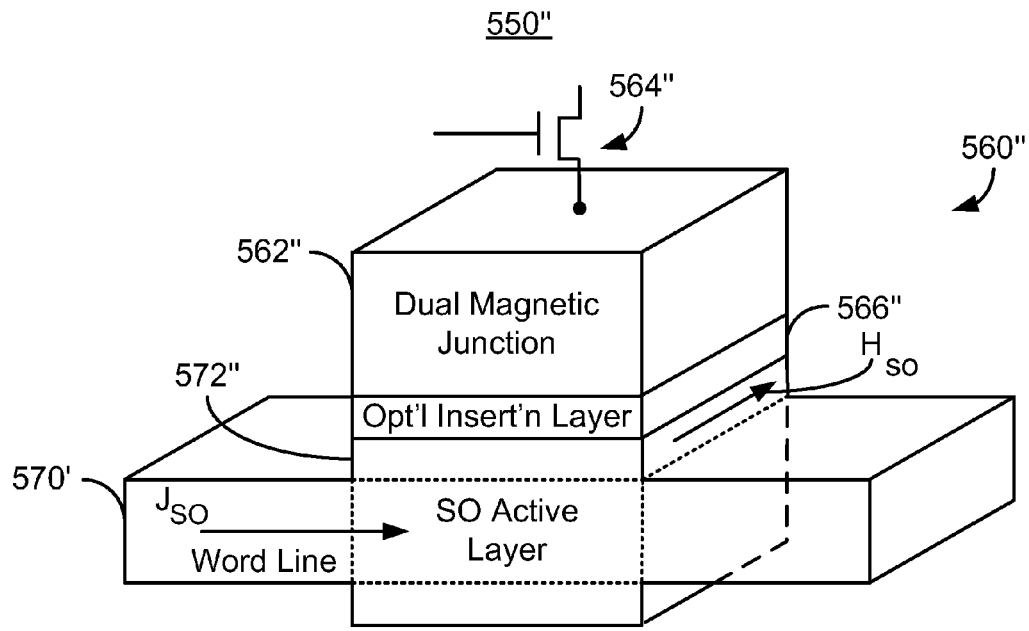
FIG. 11 depicts another exemplary embodiment of a portion of a magnetic memory that includes a dual magnetic junction switched using spin-orbit interaction.

FIG. 11 depicts an exemplary embodiment of a magnetic memory 550" employing a magnetic junction 562" switched using spin-orbit interaction. For clarity, FIG. 11 is not to scale. The magnetic memory 550" is analogous to the magnetic memories 200, 300, 400, 400', 500, 550 and/or 550'. The magnetic memory 550" thus includes a magnetic junction 562" and a SO active layer 572" that are analogous to the magnetic junction 210/310/410/410'/510 and the SO active layer 230/330/430/430'530, respectively. The structure and function of the components 562" and 572" are analogous to that described above for the components 210/310/410/410'/510 and 230/330/430/430'/530, respectively. For example, the magnetic layers may have their moments in plane or perpendicular to plane. The reference layer closest to the SO active layer 572" may also have its magnetic moment changed by the SO torque. The magnetic memory 550" may also include an optional spin diffusion insertion layer 566".

The magnetic memory 550" also includes a word line 570' analogous to the word line 570. The word line 570' extends over multiple magnetic junctions 562" and, therefore, multiple memory cells. The SO active layer 572" is electrically coupled with the word line, but is localized in the region of a single magnetic junction 562". Thus, in the embodiment shown, each SO active layer 572" corresponds to a magnetic junction 560". In the embodiment shown, the SO active layer 572" extends above and below the word line 570'. In the embodiment shown, the SO active layer 572' resides in an aperture within the word line 570'. However, in other embodiments, the top and/or bottom of the SO active layer 572" may be at another location. The SO active layer 572" is also shown as extending to the edges of the magnetic junction 562". However, in other embodiments, the SO active layer 572" may extend further than the magnetic junction 562" in the x-y plane.

The magnetic memory 550" shares the benefits of the magnetic memories 200, 300, 400, 400', 500, 550 and/or 550'. Because the spin-orbit torque is used in changing the magnetic moment reference layer closest to the SO active layer 572", performance of the memory 550" may be improved. Because the SO current is in-plane for the SO active layer 572", the current density $J_{SO}$ may be large. Further, the magnetic junction 562" may be a dual magnetic junction having enhanced spin transfer torque and/or magnetoresistance. Thus, performance of the memory 550" may be improved.

Figure 12:
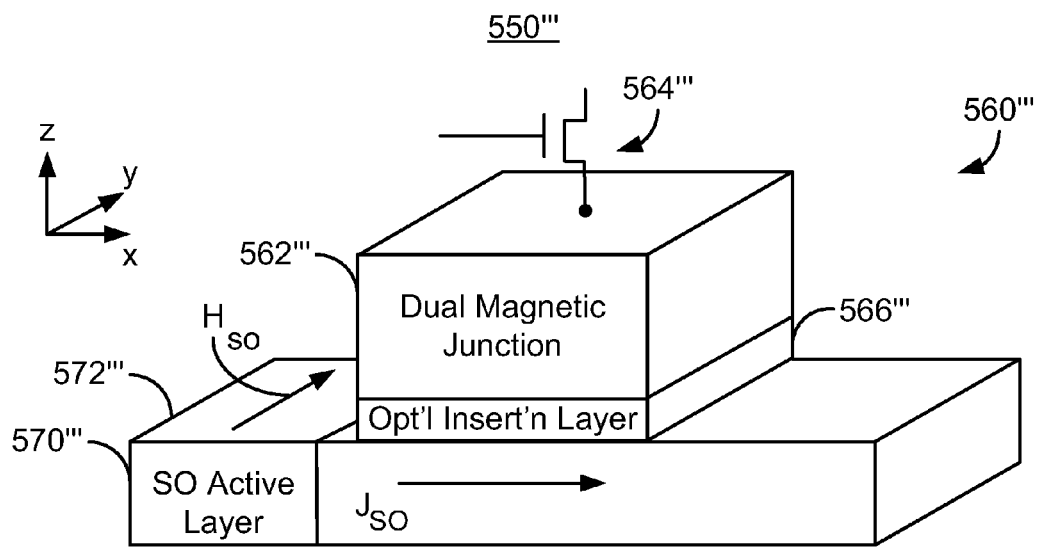
FIG. 12 depicts another exemplary embodiment of a portion of a magnetic memory that includes a dual magnetic junction switched using spin-orbit interaction.

FIG. 12 depicts an exemplary embodiment of a magnetic memory 550''' employing a magnetic junction 462''' having a reference layer with a magnetic moment changed using spin-orbit interaction. For clarity, FIG. 12 is not to scale. The magnetic memory 550''' is analogous to the magnetic memories 200, 300, 400, 400', 500, 550, 550' and/or 550''. The magnetic memory 550''' thus includes a magnetic junction 562''' and a SO active layer 572''' that are analogous to the magnetic junction 210/310/410/410'/510 and the SO active layer 230/330/430/430'/530, respectively. The structure and function of the components 562''' and 572''' are analogous to that described above for the components 210/310/410/410'/510 and 230/330/430/430'/530, respectively. For example, the magnetic layers may have their moments in plane or perpendicular to plane. The reference layer closest to the SO active layer 572''' may also have its magnetic moment changed by the SO torque. The magnetic memory 550''' may also include an optional spin diffusion insertion layer 566'''.

The magnetic memory 550''' also includes a word line 570'' analogous to the word line 230/330/430/430'/530. The word line 570'' extends over multiple magnetic junctions 562''' and, therefore, multiple memory cells. The SO active layer 572''' is electrically coupled with the word line, but is localized in the region of a single magnetic junction 562'''. In the embodiment shown, the SO active layer 572''' is adjacent to the magnetic junction 562''. The SO active layer 572''' is not directly below the magnetic junction 562''. Instead, another portion of the word line 570'' is under the magnetic junction 562'''. SO active layer 572''' can be at some separation from the magnetic junction 562'''. This separation should be not very large, typically smaller than the width of the MTJ. However for some other embodiments, it can be larger than that, up to 100 nm.

The magnetic memory 562''' shares the benefits of the magnetic memories 200, 300, 400, 400', and 500. Because the spin-orbit torque is used in switching the magnetic moment of the reference layer, performance of the memory 550''' may be improved. Because the SO current is in-plane for the SO active layer 572''', the current density $J_{SO}$ may be large. Further, the magnetic junction 562''' may be a dual magnetic junction, allowing for enhanced spin transfer torque and/or increased magnetoresistance. Thus, performance of the memory 200''' may be improved.

Figure 13:
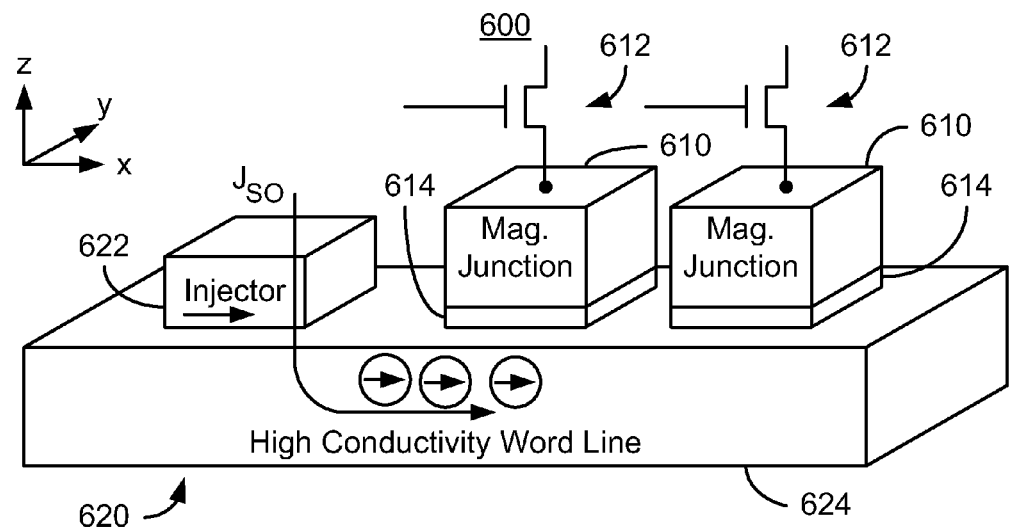
FIG. 13 depicts an exemplary embodiment of a portion of a memory including dual magnetic junctions switched using spin-orbit interaction.

FIG. 13 depicts an exemplary embodiment of a magnetic memory 600 employing a dual magnetic junction 610 having a reference layer magnetic moment that is changeable using a feature that mimics spin-orbit interaction. For clarity, FIG. 13 is not to scale. The magnetic memory 600 is analogous to the magnetic memories 200, 300, 400, 400' and/or 500. Consequently, similar components have analogous labels. The magnetic memory 600 thus includes a magnetic junction 610 and a structure 620 that are analogous to the magnetic junction 210/310/410/410'/510 and the SO active layer 230/330/430/430'/530, respectively. Thus, the structure and function of the components 610 and 620 are analogous to that described above for the components 210/310/410/410'/510 and 230/330/430/430'/530, respectively. The magnetic memory 600 may also include an optional spin diffusion insertion layer 614 analogous to the optional spin diffusion insertion layer 566.

In the context of the present application, the magnetic memory 600 is considered to use spin-orbit interaction in switching the magnetic junctions 610 because a structure 620 analogous to the SO active layer is used. More specifically, the structure 620 external to the magnetic junctions 610 provides a spin polarized in-plane current used in changing the magnetic moment of a reference layer in the magnetic junction 610. More specifically, the magnetic moment closest to the word line 624 may be changed. Thus, the switching mechanism for the memory 600 mimics spin-orbit interaction.

In the magnetic memory 600, the structure 630 analogous the SO active layer is formed from a combination of a high conductivity word line 624 and at least one spin polarized injector 622. In the embodiment shown in FIG. 13, only a single spin polarized current injector 622 is used. However, in other embodiments, multiple spin polarized injectors may be used. For example, two injectors having opposite spin polarities may be used. Alternatively, a single polarized spin injector 622 may be used. The spin polarized current injector 622 polarizes the spins of charge carriers for a current driven through the spin polarized current injector 622. For example, the spin polarized current injector 622 may be a magnetic layer. Further, a single spin polarized injector 622 is desired to provide polarized spins for multiple magnetic junctions 610. Thus, the high conductivity word line 624 is at least one conductive layer having a high spin diffusion length. For example, the spin diffusion length is at least one hundred nanometers in some embodiments. In some such embodiments, the spin diffusion length is at least one micron. For example, in one embodiment, the high conductivity word line 624 may be a graphene line. The high spin diffusion length is desired so that the spin polarized charge carriers from the injector 622 may traverse the word line 624 and reach at least one magnetic junction 610 without undergoing significant scattering that destroys the charge carriers' spin information.

Because the current is polarized by the injector 622 and retains its spin information as it travels through the high conductivity word line 624, the polarized current acts in a manner similar to the polarization of spins described above for the spin Hall and Rashba effects. Thus, the combination of the injector 622 and high conductivity word line 624 functions in an analogous manner to the SO active layers 230/330/430/430'/530. Stated differently, the spin polarized current may provide a field and torque analogous to the spin-orbit field and torque.

The magnetic memory 600 shares the benefits of the magnetic memories 200, 300, 400, 400', and 500. Because the spin-orbit torque is used in switching the magnetic moment of the reference layer, performance of the memory 600 may be improved. Further, the magnetic junction 610 may be a dual magnetic junction, allowing for enhanced spin transfer torque and/or increased magnetoresistance. Thus, performance of the memory 600 may be improved. Thus, the memories 550, 550', 550'', 550''' and 600 depict various configurations of the SO active layer 572, 572', 572'', 572''', and 620, respectively. Using one or more of these configurations, performance of a magnetic memory may be improved.

Figure 14:
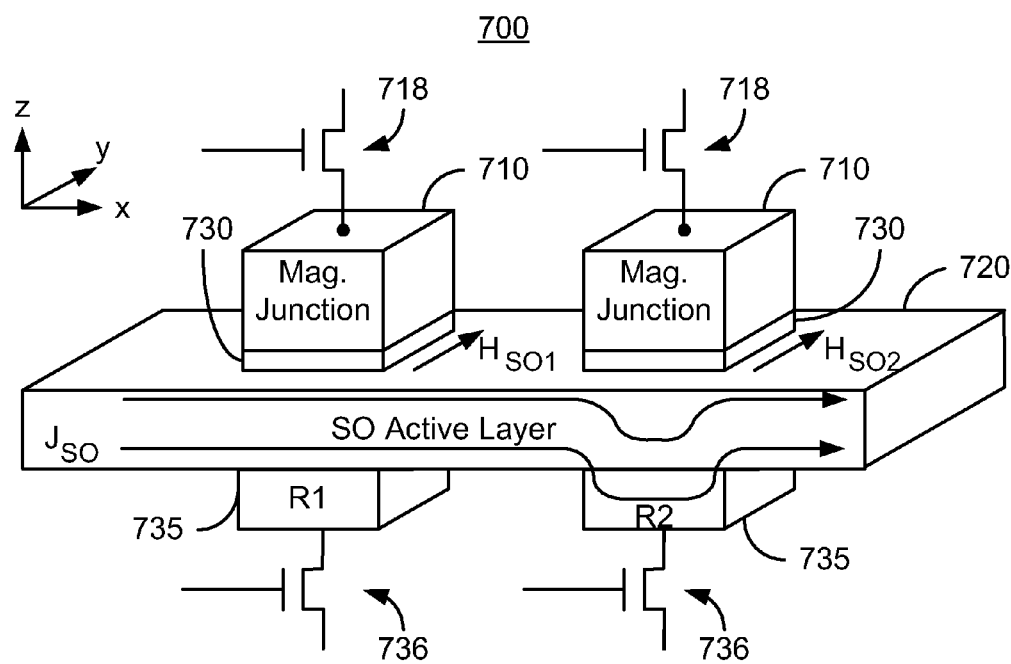
FIG. 14 depicts another exemplary embodiment of a portion of a memory including dual magnetic junctions switched using spin-orbit interaction.

FIG. 14 depicts an exemplary embodiment of a magnetic memory 700 employing magnetic junctions 710 switched primarily using spin-orbit interaction. For clarity, FIG. 14 is not to scale. The magnetic memory 700 is analogous to the magnetic memories 200, 300, 400, 400' and 500. Consequently, similar components have analogous labels. The magnetic memory 700 thus includes magnetic junctions 710, selection devices 718, an optional spin diffusion insertion layer 730, and a SO active layer 720 that are analogous to the magnetic junctions, selection devices, spin diffusion insertion layers, and the SO active layers previously described. Although not shown, the magnetic junction 710 includes a data storage/free layer, nonmagnetic spacer layers, and reference layers that are analogous to those previously described. Thus, the structure and function of the components 710 and 720 are analogous to that described above. Although the SO active layer 720 is depicted as a word line, in other embodiments, other configurations may be used. The magnetic layers of the magnetic junctions 710 may each have an easy axis in plane or perpendicular to plane. Note that although $H_{SO1}$ and $H_{SO2}$ are both shown in the x-y plane, in another embodiment, the fields $H_{SO1}$ and $H_{SO2}$ may be in another direction including perpendicular to plane.

In the memory 700, the spin-orbit interaction used in changing the magnetic moment of the reference layer is assisted by resistance control. In the embodiment shown, the resistance of a resistor 735 is controlled through resistance selection transistors 736. Thus, the resistors 735 are variable resistive elements. The resistance R1 is a high resistance relative to the resistance of the SO active layer 720. Thus, current in the SO active layer 720 is not shunted through the resistor 735. As such, the spin-orbit torque generated $H_{SO1}$ is still sufficient to change the reference layer magnetic moment for the magnetic element 710. For the resistor R2 that is lower relative to the SO active layer 720, the spin-orbit current $J_{SO}$ is shunted through the resistor R2. The accumulation of charge carriers at the top surface of the layer 720 is reduced. The spin-orbit field $H_{SO2}$ is also reduced. Thus, the spin-orbit field generated above R2 is not sufficient to change the reference layer magnetic moment of the magnetic junction 710. Thus, the magnetic memory 700 utilizes resistance changes for the magnetic junctions 710 to select the magnetic junction 710 for which the reference layer magnetic moment is to be changed. Thus, the magnetic memory 700 may be considered to use resistance changes for selecting the dual magnetic junction to be written and/or read.

The magnetic memory 700 shares the benefits of the magnetic memories 200, 300, 400, 400' and 500. Because the spin-orbit torque is used in changing the magnetic moment of the reference layer, performance of the memory 700 may be improved. Further, the desired magnetic junction 720 to be programmed may be selected using resistance changes. Thus, performance of the memory 700 may be improved.

Figure 15:
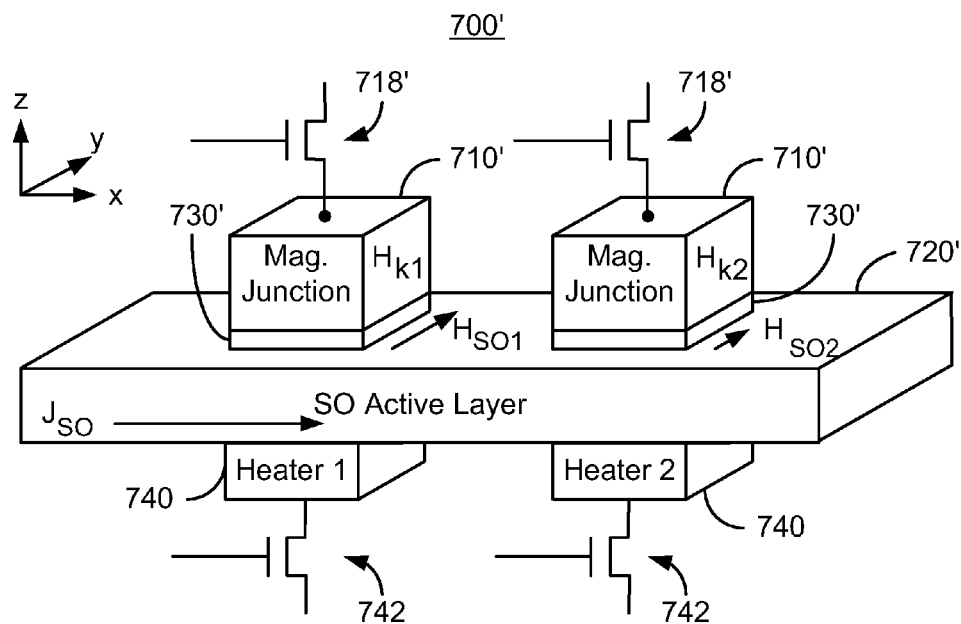
FIG. 15 depicts another exemplary embodiment of a portion of a memory including dual magnetic junctions switched using spin-orbit interaction.

FIG. 15 depicts an exemplary embodiment of a magnetic memory 700' employing magnetic junctions 710' using spin-orbit interaction to change the magnetic moment of the reference layer. For clarity, FIG. 15 is not to scale. The magnetic memory 700' is analogous to the magnetic memories 200, 300, 400, 400' and 500. Consequently, similar components have analogous labels. The magnetic memory 700' thus includes magnetic junctions 710', selection devices 718', an optional spin diffusion insertion layer 730', and a SO active layer 720' that are analogous to the magnetic junctions, selection devices, spin diffusion insertion layers, and the SO active layers previously described. Although not shown, the magnetic junction 710' includes a data storage/free layer, nonmagnetic spacer layers, and reference layers that are analogous to those previously described. Thus, the structure and function of the components 710' and 720' are analogous to that described above. Although the SO active layer 720' is depicted as a word line, in other embodiments, other configurations may be used. The magnetic layers of the magnetic junctions 710' may each have an easy axis in plane or perpendicular to plane. Note that although $H_{SO1}$ and $H_{SO2}$ are shown in the x-y plane, in another embodiment, the fields $H_{SO1}$ and $H_{SO2}$ may be in another direction including perpendicular to plane.

In the memory 700', the spin-orbit interaction switching is assisted by heating of the SO active layer 720' using heaters 740. The heaters 740 are controlled through heater selection transistors 742. When the heating element, such as heater 1, is quiescent, the SO active layer 720' may generate the desired spin-orbit field $H_{SO1}$ for changing the magnetic moment of the reference layer of the magnetic junction 710'. However, the heater 2 may be driven. The SO active layer 720' is heated, which increases relaxation of the SO-induced spin accumulations and thus reduces the spin-orbit field $H_{SO2}$. The spin-orbit field generated is not sufficient to change the magnetic moment of the reference layer of the magnetic junction 710'. Thus, the magnetic memory 700' utilizes heating of the SO active layer 720' to select the magnetic junction 720' for which the reference layer magnetic moment is changed. The magnetic junction 720' may have its reference layer magnetic moment changed using heating.

Applicant also notes that switching of the magnetic momentums of the free and/or reference layers of the magnetic junctions 710' may be improved through heating. The heater 740 and/or a heating current driven through the magnetic junctions 710' may heat the magnetic junctions 710. As a result, the magnetic moment of the free layer and/or of the reference layers may be more thermally unstable and, therefore, easier to switch. Thus, switching and reference layer magnetic moment changes may be assisted using heating.

The magnetic memory 700' shares the benefits of the magnetic memories 200, 300, 400, 400' and 500. Because the spin-orbit torque is used in changing the magnetic moment of the reference layer, performance of the memory 700' may be improved. Further, the desired magnetic junction 710' to be programmed may be selected using heating. Thus, performance of the memory 700' may be improved.

Figure 16:
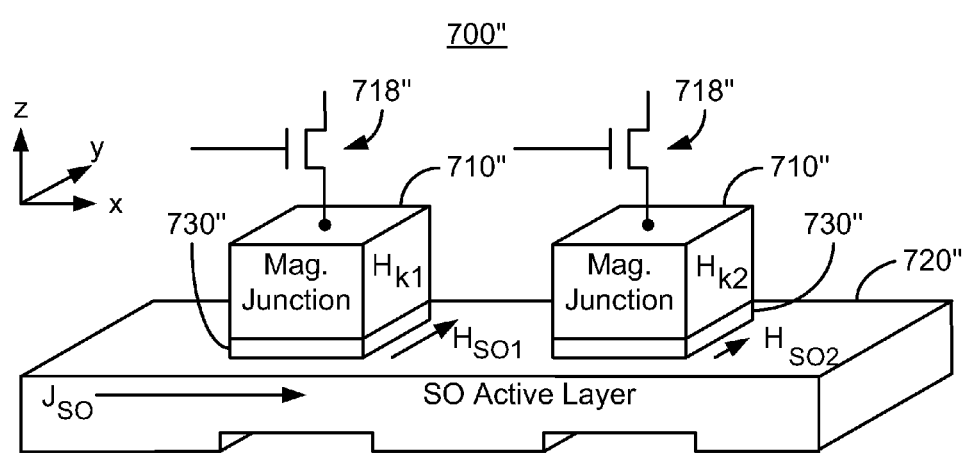
FIG. 16 depicts another exemplary embodiment of a portion of a memory including dual magnetic junctions switched using spin-orbit interaction.

FIG. 16 depicts an exemplary embodiment of a magnetic memory 700" employing magnetic junctions 710" using spin-orbit interaction to change the magnetic moment of the reference layer. For clarity, FIG. 16 is not to scale. The magnetic memory 700" is analogous to the magnetic memories 200, 300, 400, 400' and 500. Consequently, similar components have analogous labels. The magnetic memory 700" thus includes magnetic junctions 710", selection devices 718", an optional spin diffusion insertion layer 730", and a SO active layer 720" that are analogous to the magnetic junctions, selection devices, spin diffusion insertion layers, and the SO active layers previously described. Although not shown, the magnetic junction 710" includes a data storage/free layer, nonmagnetic spacer layers, and reference layers that are analogous to those previously described. Thus, the structure and function of the components 710' and 720' are analogous to that described above. Although the SO active layer 720" is depicted as a word line, in other embodiments, other configurations may be used. The magnetic layers of the magnetic junctions 710' may each have an easy axis in plane or perpendicular to plane. Note that although $H_{SO1}$ and $H_{S02}$ are shown in the x-y plane, in another embodiment, the fields $H_{SO1}$ and $H_{SO2}$ may be in another direction including perpendicular to plane.

In the memory 700", the spin-orbit interaction change in magnetic moment is assisted by the concentration of spin orbit current in the region of the magnetic junctions 710". In the embodiment shown, the thickness of the SO active layer 720" (in the z-direction) is restricted in the region of the magnetic junctions 710". In other embodiments, the width (in the y direction) or both the thickness and the width may be restricted such that the cross-sectional area of the SO active layer 720" is reduced in the region of the magnetic junctions 710". As a result, the spin orbit current may be concentrated in these regions and able to apply a larger spin orbit torque for a given current.

The magnetic memory 700" shares the benefits of the magnetic memories 200, 300, 400, 400' and 500. Because the spin-orbit torque is used in changing the magnetic moment of the reference layer, performance of the memory 700" may be improved. Further, the desired magnetic junction 710" to be programmed may be selected using heating. Thus, performance of the memory 700" may be improved.

Applicant also notes that in any of the memories 700, 700', and 700" the anisotropy of the reference layer closest to the SO active layer 720, 720' and 720", respectively, may be changeable. For example, the anisotropy of the reference layer may be changed by a voltage applied to the reference layer. In such embodiments, the magnetic junction 710/710'/710" may be selected for a change in the reference layer magnetic moment by applying a control voltage to the magnetic junction 710/710'/710". Further, this control voltage may be used in other memories including but not limited to the memories 200, 300, 400, 400', 500, 550, 550', 550", 550'" and/or 600.

Figure 17:
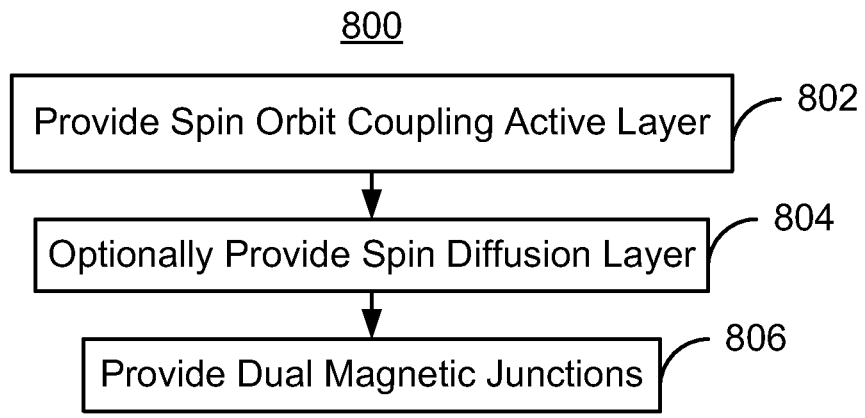
FIG. 17 is a flow chart depicting an exemplary embodiment of a method for providing magnetic junction(s) switched using spin-orbit interaction.

FIG. 17 is a flow chart depicting an exemplary embodiment of a method 800 for providing a magnetic memory having magnetic junction(s) switched using spin-orbit interaction. For simplicity, some steps may be omitted, combined, and/or interleaved. The method 800 is described in the context of the magnetic memory 200. However, the method 800 may be used to provide other magnetic memories including but not limited to the magnetic memories 300, 400, 400', 500, 550, 550', 550", 550'", 600, 700, 700' and/or 700".

The SO active layer 230 is provided, via step 802. In some embodiments, step 804 includes providing a layer appropriate for the spin Hall effect. In other embodiments, a layer appropriate for the Rashba effect is provided. In still other embodiments, the SO active layer provided may use a combination of the spin Hall effect and the Rashba effect. Other spin-orbit interaction mechanisms might also be provided. Step 804 may also include patterning the SO active layer. A spin diffusion layer (not shown in the magnetic memory 200) may optionally be provided, via step 804. The spin diffusion layer, if provided, resides between the SO active layer 120 and the magnetic junctions 110.

The dual magnetic junctions 210 are provided, via step 806. In some embodiments, step 806 includes providing a first reference layer 212, a first nonmagnetic spacer layer 214, a free layer 216, a second nonmagnetic layer such as a tunneling barrier layer 208 and a second reference layer 220. Fabrication of the magnetic memory 200 may then be completed. Thus, using the method 800, the benefits of one or more of the magnetic memories 200, 300, 400, 400', and/or 500 may be achieved.

Figure 18:
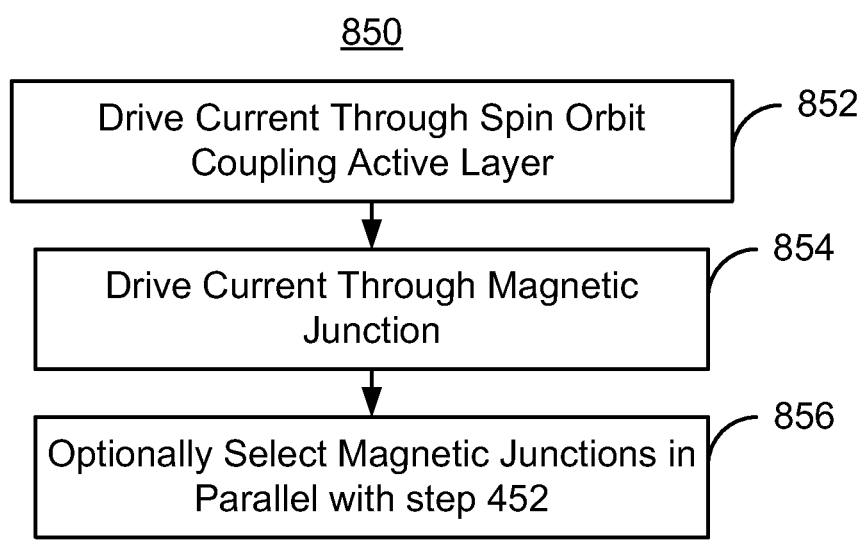
FIG. 18 is a flow chart depicting an exemplary embodiment of a method for programming magnetic junction(s) switched using spin-orbit interaction.

FIG. 18 is a flow chart depicting an exemplary embodiment of a method 850 for programming magnetic junction(s) switched using spin-orbit interaction. The method 850 may be used with one or more of the memories 200, 300, 400, 400' and/or 500. For simplicity, some steps may be omitted, combined, and/or interleaved. The method 850 is described in the context of the magnetic memory 100. However, the method 850 may be used with other magnetic junctions including but not limited to the magnetic memories 200, 300, 400, 400', 500, 550, 550', 550", 550'", 600, 700, 700' and/or 700".

An in-plane spin-orbit write current is applied, via step 852. The spin-orbit write current may be applied as a pulse. The magnitude and duration of the pulse may be sufficient to switch the direction of the magnetic moment 213 if the reference layers 212 and 220 are desired to be switched between the dual and antidual states. For example, such a pulse may be used for the memory 500. In other embodiments, the magnitude and duration of the pulse is sufficient to cant the magnetic moment 213 of the reference layer 212 and allow the stray field generated to perturb the moment 217 of the free layer 216 from the stagnation point.

A spin transfer torque write current is driven through the magnetic junction 210, via step 854. The current in step 854 may also be applied as a pulse, as described above. The current pulse applied in step 854 may be desired to be timed with respect to the spin orbit current driven in step 852 such that the free layer 216 is not at the stagnation at or before the pulse starts. In other embodiments, the timing may be different. Thus, the writing of the cells may be completed using steps 852 and 854.

In addition, the magnetic junctions 210 to be written may be selected, via step 856. For example, spin transfer torque, heating of the magnetic junction 110, resistance control over the SO active layer 230, heating of the SO active layer 230, some combination of the above and/or another mechanism may be used to select the cells to be written. Step 856 may also be performed at substantially the same time as step 852. Thus, the desired magnetic junctions 210 in the magnetic memory 200 may be programmed. Note that the magnetic junctions 210 may be read by driving a read current through the magnetic junctions 210 and determining whether the magnetic junctions 210 are in a high resistance state or a low resistance state. As part of reading, the magnetic junctions may be switched from a dual state of the reference layers to the antidual state.

Thus, using the method 850, the magnetic memories 200, 300, 400, 400' and/or 500 may be programmed. Thus, the benefits of the magnetic memories 200, 300, 400, 400' and/or 500 may be achieved.

A method and system for providing a dual magnetic junction and a memory fabricated using the dual magnetic junction has been described. Various combinations of features in the magnetic memories 200, 300, 400, 400', 500, 550, 550', 550", 550'". 600, 700, 700' and/or 700" may be combined. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic memory comprising:
 a plurality of dual magnetic junctions, each of the plurality of dual magnetic junctions including a first reference layer, a first nonmagnetic spacer layer, a free layer, a second nonmagnetic spacer layer and a second reference layer, the free layer being magnetic and residing between the first nonmagnetic spacer layer and the second nonmagnetic spacer layer, the first nonmagnetic spacer layer being between the first reference layer and the free layer, the second nonmagnetic spacer layer being between the second reference layer and the free layer; and
 at least one spin-orbit interaction (SO) active layer adjacent to the first reference layer of each of the plurality of dual magnetic junctions, the at least one SO active layer configured to exert a SO torque on the first reference layer due to a current passing through the at least one SO active layer substantially perpendicular to a direction between the at least one SO active layer and the first reference layer and to exert no SO torque on the first reference layer in the absence of the current, the free layer configured to be switchable using a spin transfer write current driven through the dual magnetic junction, the first reference layer having a magnetic moment configured to be changeable by at least the SO torque.

2. The magnetic memory of claim 1 wherein at least one of the first reference layer and the second reference layer is a synthetic layer including a plurality of ferromagnetic layers.

3. The magnetic memory of claim 1 wherein at least one of the first nonmagnetic spacer layer and the second nonmagnetic spacer layer is a tunneling barrier layer.

4. The magnetic memory of claim 1 further comprising:
a spin diffusion insertion layer for each of the at least one SO active layer, the spin diffusion insertion layer being between the first reference layer and the at least one SO active layer.

5. The magnetic memory of claim 1 wherein the SO active layer adjoins the first reference layer.

6. The magnetic memory of claim 1 wherein the at least one SO active layer includes at least one of A and M doped by B where A includes at least one of Y, Zr, Nb, Mo, Tc, Ru, Rh, Pd, Cd, In, Sb, Te, Hf, Ta, amorphous β-Ta, W, Re, Os, Ir, Pt, Au, Hg, Tl, Pb, Bi, Po, and At where M includes at least one of Al, Ti, V, Cr, Mn, Cu, Zn, Ag, Hf, Ta, W, Re, Pt, Au, Hg, Pb, Si, Ga, GaMn and GaAs, and B includes at least one of V, Cr, Mn, Fe, Co, Ni, P, S, Zn, Ga, Ge, As, Se, Y, Zr, Nb, Mo, Tc, Ru, Rh, Pd, Ag, Cd, In Sb, Te, I, Lu, Hf, Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, and Yb.

7. The magnetic memory of claim 1 wherein the at least one SO active layer includes at least one of Z, or at least one surface alloy of A/B residing on a (111) surface of a host material B, or material Q, or a combination thereof, A includes at least one of Cu, Zn, Ga, Ge, As, Se, Y, Zr, Nb, Mo, Tc, Ru, Rh, Pd, Ag, Cd, In, Sn, Sb, Te, I, Lu, Hf, Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, and Yb, and B includes at least one of Si, Zn, Cu, Ag, Au, W, Zn, Cr, Pt, Pd; alloys A/B include substitutional Bi/Ag, substitutional Pb/Ag, substitutional Sb/Ag, substitutional Bi/Si, substitutional Ag/Pt, substitutional Pb/Ge, substitutional Bi/Cu, Z includes at least one of Cu, Zn, Ga, Ge, As, Se, Y, Zr, Nb, Mo, Tc, Ru, Rh, Pd, Ag, Cd, In, Sn, Sb, Te, I, Lu, Hf, Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, Yb, Q includes at least one of InGaAs, HgCdTe, a LaAlO$_3$/SrTiO$_3$ bilayer, and LaTiO$_3$/SrTiO$_3$ bilayer.

8. The magnetic memory of claim 1 wherein the at least one SO active layer includes at least one of Cu, Zn, Ga, Ge, As, Se, Y, Zr, Nb, Mo, Tc, Ru, Rh, Pd, Ag, Cd, In, Sn, Sb, Te, I, Lu, Hf, Ta, amorphous β-Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, and Yb.

9. The magnetic memory of claim 1 wherein the at least one SO active layer is an SO active word line extending over at least two of the plurality of dual magnetic junctions.

10. The magnetic memory of claim 1 further comprising:
at least one word line corresponding to the plurality of dual magnetic junctions, the at least one SO active layer residing between the first reference layer and the at least one word line.

11. The magnetic memory of claim 10 wherein the at least one word line includes at least one aperture corresponding to each of the at least one SO active layer.

12. The magnetic memory of claim 1 wherein the free layer has an easy axis that is substantially perpendicular to plane.

13. The magnetic memory of claim 1 wherein the free layer has an easy axis that is in plane.

14. The magnetic memory of claim 13 wherein the magnetic moment of the reference layer is configured to be changed by the spin transfer torque and a heating current driven through the reference layer.

15. A magnetic memory comprising:
a plurality of dual magnetic junctions, each of the plurality of dual magnetic junctions including a first reference layer, a first nonmagnetic spacer layer, a free layer, a second nonmagnetic spacer layer and a second reference layer, the free layer being magnetic and residing between the first nonmagnetic spacer layer and the second nonmagnetic spacer layer, the first nonmagnetic spacer layer being between the first reference layer and the free layer, the second nonmagnetic spacer layer being between the second reference layer and the free layer; and
at least one spin-orbit interaction (SO) active layer adjacent to the first reference layer of each of the plurality of dual magnetic junctions, the at least one SO active layer configured to exert a SO torque on the first reference layer due to a current passing through the at least one SO active layer substantially perpendicular to a direction between the at least one SO active layer and the first reference layer, the free layer configured to be switchable using a spin transfer write current driven through the dual magnetic junction, the first reference layer having a magnetic moment configured to be changeable by at least the SO torque;
wherein the free layer has a free layer magnetic moment having a plurality of stable states along an easy axis and wherein the magnetic moment of the first reference layer is tilted to a nonzero angle from the easy axis by the at least the SO torque.

16. A magnetic memory comprising:
a plurality of dual magnetic junctions, each of the plurality of dual magnetic junctions including a first reference layer, a first nonmagnetic spacer layer, a free layer, a second nonmagnetic spacer layer and a second reference layer, the free layer being magnetic and residing between the first nonmagnetic spacer layer and the second nonmagnetic spacer layer, the first nonmagnetic spacer layer being between the first reference layer and the free layer, the second nonmagnetic spacer layer being between the second reference layer and the free layer; and
at least one spin-orbit interaction (SO) active layer adjacent to the first reference layer of each of the plurality of dual magnetic junctions, the at least one SO active layer configured to exert a SO torque on the first reference layer due to a current passing through the at least one SO active layer substantially perpendicular to a direction between the at least one SO active layer and the first reference layer, the free layer configured to be switchable using a spin transfer write current driven through the dual magnetic junction, the first reference layer having a magnetic moment configured to be changeable by at least the SO torque;
wherein the second reference layer has an additional reference layer magnetic moment and wherein the magnetic moment of the first reference layer is configured to be changed by the SO torque to be in the dual state for a write operation and to be in the antidual state for a read operation.

17. The magnetic memory of claim 16 wherein the free layer has a free layer magnetic moment having a plurality of stable states along an easy axis and wherein the magnetic moment of the first reference layer is stable along the easy axis in the absence of the SO torque.

18. The magnetic memory of claim 16 wherein the free layer has a free layer magnetic moment having a plurality of stable states along an easy axis and wherein the magnetic moment of the first reference layer is stable along the easy axis in the presence of the SO torque and unstable with respect to the easy axis in the absence of the SO torque.

19. A magnetic memory comprising:
a plurality of dual magnetic junctions, each of the plurality of dual magnetic junctions including a first reference layer, a first nonmagnetic spacer layer, a free layer, a second nonmagnetic spacer layer and a second reference layer, the free layer being magnetic and residing between the first nonmagnetic spacer layer and the second nonmagnetic spacer layer, the first nonmagnetic spacer layer being between the first reference layer and the free layer, the second nonmagnetic spacer layer being between the second reference layer and the free layer;
at least one spin-orbit interaction (SO) active layer adjacent to the first reference layer of each of the plurality of dual magnetic junctions, the at least one SO active layer configured to exert a SO torque on the first reference layer due to a current passing through the at least one SO active layer substantially perpendicular to a direction between the at least one SO active layer and the first reference layer, the free layer configured to be switchable using a spin transfer write current driven through the dual magnetic junction, the first reference layer having a magnetic moment configured to be changeable by at least the SO torque; and
a spin diffusion insertion layer for each of the at least one SO active layer, the spin diffusion insertion layer being between the first reference layer and the at least one SO active layer
wherein the spin diffusion layer includes at least one of a metal layer, an insulating layer having a resistance area of less than $2 \, \Omega\text{-}\mu m^2$, and a multilayer including a first layer and a second layer, the first layer including a first material, the second layer including a second material different from the first material.

20. A magnetic memory comprising:
a plurality of dual magnetic junctions, each of the plurality of dual magnetic junctions including a first reference layer, a first nonmagnetic spacer layer, a free layer, a second nonmagnetic spacer layer and a second reference layer, the free layer being magnetic and residing between the first nonmagnetic spacer layer and the second nonmagnetic spacer layer, the first nonmagnetic spacer layer being between the first reference layer and the free layer, the second nonmagnetic spacer layer being between the second reference layer and the free layer;
at least one spin-orbit interaction (SO) active layer adjacent to the first reference layer of each of the plurality of dual magnetic junctions, the at least one SO active layer configured to exert a SO torque on the first reference layer due to a current passing through the at least one SO active layer substantially perpendicular to a direction between the at least one SO active layer and the first reference layer, the free layer configured to be switchable using a spin transfer write current driven through the dual magnetic junction, the first reference layer having a magnetic moment configured to be changeable by at least the SO torque;
wherein the at least one SO active layer is an SO active word line extending over at least two of the plurality of dual magnetic junctions; and
wherein a portion of the SO active layer adjacent to each of the plurality of dual magnetic junctions has a first thickness and a first width, the SO active layer having a second thickness and a second width between two of the plurality of dual magnetic junctions, a first product of the first thickness and the first width being less than a second product of the second width and the second thickness.

21. A magnetic memory comprising:
a plurality of dual magnetic junctions, each of the plurality of dual magnetic junctions including a first reference layer, a first nonmagnetic spacer layer, a free layer, a second nonmagnetic spacer layer and a second reference layer, the free layer being magnetic and residing between the first nonmagnetic spacer layer and the second nonmagnetic spacer layer, the first nonmagnetic spacer layer being between the first reference layer and the free layer, the second nonmagnetic spacer layer being between the second reference layer and the free layer;
at least one spin-orbit interaction (SO) active layer adjacent to the first reference layer of each of the plurality of dual magnetic junctions, the at least one SO active layer configured to exert a SO torque on the first reference layer due to a current passing through the at least one SO active layer substantially perpendicular to a direction between the at least one SO active layer and the first reference layer, the free layer configured to be switchable using a spin transfer write current driven through the dual magnetic junction, the first reference layer having a magnetic moment configured to be changeable by at least the SO torque;
wherein the SO active layer further includes at least one spin polarized current injector for polarizing a plurality of spins of a plurality of charge carriers for the current; and
at least one conductive layer having a high spin diffusion length, the at least one conductive layer being between the at least one spin polarized current injector and the plurality of dual magnetic junctions.

22. A magnetic memory comprising:
a plurality of dual magnetic junctions, each of the plurality of dual magnetic junctions including a first reference layer, a first nonmagnetic spacer layer, a free layer, a second nonmagnetic spacer layer and a second reference layer, the free layer being magnetic and residing between the first nonmagnetic spacer layer and the second nonmagnetic spacer layer, the first nonmagnetic spacer layer being between the first reference layer and the free layer, the second nonmagnetic spacer layer being between the second reference layer and the free layer;
at least one spin-orbit interaction (SO) active layer adjacent to the first reference layer of each of the plurality of dual magnetic junctions, the at least one SO active layer configured to exert a SO torque on the first reference layer due to a current passing through the at least one SO active layer substantially perpendicular to a direction between the at least one SO active layer and the first reference layer, the free layer configured to be switchable using a spin transfer write current driven through the dual magnetic junction, the first reference layer having a magnetic moment configured to be changeable by at least the SO torque;
wherein the free layer has an easy axis that is in plane; and
wherein the magnetic moment of the first reference layer is configured to be changed using the SO torque and an anisotropy control voltage applied to reference layer, the anisotropy control voltage configured to change a magnetic anisotropy of the reference layer.

23. A magnetic memory comprising:
a plurality of dual magnetic junctions, each of the plurality of dual magnetic junctions including a first reference layer, a first nonmagnetic spacer layer, a free layer, a second nonmagnetic spacer layer and a second reference layer, the free layer being magnetic and residing between the first nonmagnetic spacer layer and the second nonmagnetic spacer layer, the first nonmagnetic spacer layer being between the first reference layer and the free layer, the second nonmagnetic spacer layer being between the second reference layer and the free layer;
at least one spin-orbit interaction (SO) active layer adjacent to the first reference layer of each of the plurality of dual magnetic junctions, the at least one SO active layer configured to exert a SO torque on the first reference layer due to a current passing through the at least one SO active layer substantially perpendicular to a direction between the at least one SO active layer and the first reference layer, the free layer configured to be switchable using a spin transfer write current driven through the dual magnetic junction, the first reference layer having a magnetic moment configured to be changeable by at least the SO torque; and
a plurality of variable resistive elements corresponding to the plurality of magnetic elements and being adjacent to the at least one SO active layer, each of the plurality of variable resistive elements configured to have a low resistance state and shunt the current from the at least one SO active layer in a first region corresponding to at least one magnetic element of the plurality of magnetic elements that is not to be written, each of the plurality of variable resistive elements configured to have a high resistance state in a second region corresponding to at least another magnetic element of the plurality of magnetic elements that is to be written, the at least one SO active layer generating the SO torque in the second region;
wherein the free layer has an easy axis that is in plane; and
wherein the magnetic moment of the reference layer is configured to be changed by the spin transfer torque and a heating current driven through the reference layer.

24. A magnetic memory comprising:
a plurality of dual magnetic junctions, each of the plurality of dual magnetic junctions including a first reference layer, a first nonmagnetic spacer layer, a free layer, a second nonmagnetic spacer layer and a second reference layer, the free layer being magnetic and residing between the first nonmagnetic spacer layer and the second nonmagnetic spacer layer, the first nonmagnetic spacer layer being between the first reference layer and the free layer, the second nonmagnetic spacer layer being between the second reference layer and the free layer, the free layer having an easy axis that is in plane;
at least one spin-orbit interaction (SO) active layer adjacent to the first reference layer of each of the plurality of dual magnetic junctions, the at least one SO active layer configured to exert a SO torque on the first reference layer due to a current passing through the at least one SO active layer substantially perpendicular to a direction between the at least one SO active layer and the first reference layer, the free layer configured to be switchable using a spin transfer write current driven through the dual magnetic junction, the first reference layer having a magnetic moment configured to be changeable by at least the SO torque;
a plurality of heating elements corresponding to the plurality of magnetic elements and being adjacent to the at least one SO active layer, each of the plurality of heating elements configured to heat the at least one SO active layer in a region corresponding to at least one magnetic element of the plurality of magnetic elements that is not to be written, the at least one SO active layer generating the SO torque at a portion of the plurality of heating elements that is not heating the at least one SO active layer.

25. A method for providing a magnetic memory comprising:
providing a plurality of dual magnetic junctions, each of the plurality of dual magnetic junctions including a first reference layer, a first nonmagnetic spacer layer, a free layer, a second nonmagnetic spacer layer and a second reference layer, the free layer being magnetic and residing between the first nonmagnetic spacer layer and the second nonmagnetic spacer layer, the first nonmagnetic spacer layer being between the first reference layer and the free layer, the second nonmagnetic spacer layer being between the second reference layer and the free layer; and
providing at least one spin-orbit interaction (SO) active layer adjacent to the first reference layer of each of the plurality of dual magnetic junctions, the at least one SO active layer configured to exert a SO torque on the first reference layer due to a current passing through the at least one SO active layer substantially perpendicular to a direction between the at least one SO active layer and the first reference layer, the at least one SO active layer also configured to exert no SO torque on the first reference layer in the absence of the current, the free layer configured to be switchable using a spin transfer write current driven through the dual magnetic junction, the first reference layer having a magnetic moment configured to be changeable by at least the SO torque.

26. A method for programming a magnetic memory including a plurality of dual magnetic junctions, each of the plurality of dual magnetic junctions including a first reference layer, a first nonmagnetic spacer layer, a free layer, a second nonmagnetic spacer layer and a second reference layer, the free layer being magnetic and residing between the first nonmagnetic spacer layer and the second nonmagnetic spacer layer, the first nonmagnetic spacer layer being between the first reference layer and the free layer, the second nonmagnetic spacer layer being between the second reference layer and the free layer, the free layer being magnetic the method comprising:
driving a current through at least one spin-orbit interaction (SO) active layer adjacent to the first reference layer of the dual magnetic junction, the at least one SO active layer configured to exert a SO torque on the first reference layer due to a current passing through the at least one SO active layer substantially perpendicular to a direction between the at least one SO active layer and the first reference layer of a dual magnetic junction of the plurality of dual magnetic junctions closest to the at least one SO active layer, the at least one SO active layer also configured to exert no SO torque on the first reference layer in the absence of the current, the first reference layer having a magnetic moment changed by at least the SO torque; and
driving a spin transfer write current through the dual magnetic junction, thereby writing to the free layer.

27. The method of claim 26 wherein the step of driving the current through the at least one SO active layer includes driving a first current pulse through the at least one SO active layer and wherein the step of driving the spin transfer write current further includes:

driving a second current pulse through a portion of the at least one dual magnetic junction after the first current pulse starts.

28. The method of claim 26 further comprising:

selecting at least one of the plurality of dual magnetic junctions for writing.

29. A method for programming a magnetic memory including a plurality of dual magnetic junctions, each of the plurality of dual magnetic junctions including a first reference layer, a first nonmagnetic spacer layer, a free layer, a second nonmagnetic spacer layer and a second reference layer, the free layer being magnetic and residing between the first nonmagnetic spacer layer and the second nonmagnetic spacer layer, the first nonmagnetic spacer layer being between the first reference layer and the free layer, the second nonmagnetic spacer layer being between the second reference layer and the free layer, the free layer being magnetic the method comprising:

driving a current through at least one spin-orbit interaction (SO) active layer adjacent to the first reference layer of the dual magnetic junction, the at least one SO active layer configured to exert a SO torque on the first reference layer due to a current passing through the at least one SO active layer substantially perpendicular to a direction between the at least one SO active layer and the first reference layer of a dual magnetic junction of the plurality of dual magnetic junctions closest to the at least one SO active layer, the first reference layer having a magnetic moment changed by at least the SO torque; and driving a spin transfer write current through the dual magnetic junction, thereby writing to the free layer;

wherein the free layer has a free layer magnetic moment having a plurality of stable states along an easy axis and wherein the step of driving the current through the at least one SO active layer tilts the magnetic moment of the first reference layer to a nonzero angle from the easy axis.

30. A method for programming a magnetic memory including a plurality of dual magnetic junctions, each of the plurality of dual magnetic junctions including a first reference layer, a first nonmagnetic spacer layer, a free layer, a second nonmagnetic spacer layer and a second reference layer, the free layer being magnetic and residing between the first nonmagnetic spacer layer and the second nonmagnetic spacer layer, the first nonmagnetic spacer layer being between the first reference layer and the free layer, the second nonmagnetic spacer layer being between the second reference layer and the free layer, the free layer being magnetic the method comprising:

driving a current through at least one spin-orbit interaction (SO) active layer adjacent to the first reference layer of the dual magnetic junction, the at least one SO active layer configured to exert a SO torque on the first reference layer due to a current passing through the at least one SO active layer substantially perpendicular to a direction between the at least one SO active layer and the first reference layer of a dual magnetic junction of the plurality of dual magnetic junctions closest to the at least one SO active layer, the first reference layer having a magnetic moment changed by at least the SO torque; and driving a spin transfer write current through the dual magnetic junction, thereby writing to the free layer;

wherein the second reference layer has an additional reference layer magnetic moment and wherein the step of driving the current through the at least one SO active layer changes the magnetic moment of the first reference layer to be in the antidual state for a write operation and to be in the dual state for a read operation.

* * * * *